US012777806B2

(12) United States Patent
Wu et al.

(10) Patent No.: US 12,777,806 B2
(45) Date of Patent: Oct. 27, 2026

(54) ELECTRONIC DEVICE COMPRISING DISPLAY AND METHOD FOR OPERATING SAME

(71) Applicant: Samsung Electronics Co., Ltd., Suwon-si (KR)

(72) Inventors: Yilin Wu, Suwon-si (KR); Sungyoung Shin, Suwon-si (KR); Minsuk Uhm, Suwon-si (KR); Dongseop Lee, Suwon-si (KR); Haechang Lee, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 411 days.

(21) Appl. No.: 18/581,979

(22) Filed: Feb. 20, 2024

(65) Prior Publication Data

US 2024/0196690 A1 Jun. 13, 2024

Related U.S. Application Data

(63) Continuation of application No. PCT/KR2022/010928, filed on Jul. 26, 2022.

(30) Foreign Application Priority Data

Sep. 6, 2021 (KR) ........................ 10-2021-0118638

(51) Int. Cl.
*H10K 59/35* (2023.01)
*H10K 59/40* (2023.01)
*H10K 59/80* (2023.01)

(52) U.S. Cl.
CPC .......... *H10K 59/353* (2023.02); *H10K 59/40* (2023.02); *H10K 59/8792* (2023.02)

(58) Field of Classification Search
CPC .................................................... H10K 59/353
See application file for complete search history.

(56) References Cited

U.S. PATENT DOCUMENTS 9,601,052 B2 3/2017 Jeon
10,264,144 B2 4/2019 Oguchi et al.
(Continued)

FOREIGN PATENT DOCUMENTS

KR 10-2018-0028088 A 3/2018
KR 10-2018-0135342 A 12/2018
(Continued)

OTHER PUBLICATIONS

Extended European Search Report dated Dec. 18, 2024, issued in European Application No. 22864874.7.
(Continued)

*Primary Examiner* — William A Harriston
(74) *Attorney, Agent, or Firm* — Jefferson IP Law, LLP

(57) ABSTRACT

A display device is provided. The display device includes a substrate, a plurality of pixels disposed on the substrate and including a first pixel and a second pixel, a first opaque member located not to overlap a first light emitting area of a first sub-pixel that displays a first color included in the first pixel and to surround a circumference of the first light emitting area, and a second opaque member disposed to overlap at least a portion of a second light emitting area of a second sub-pixel that displays a second color included in the second pixel and to wrap a periphery of the second light emitting area around once by a specific first thickness, wherein the first light emitting area is an area, in which a first electrode of the first sub-pixel and a first organic light emitting layer of the first sub-pixel contact each other, and the first light emitting area may include at least two divided areas, and wherein the second light emitting area may be an area, in which a second electrode of the second sub-pixel
(Continued)

and a second organic light emitting layer of the second sub-pixel contact each other, and the second pixel does not include an opaque member at a portion, at which the second pixel does not overlap the second light emitting area.

20 Claims, 17 Drawing Sheets

(56) References Cited

U.S. PATENT DOCUMENTS

| | | | | |
|---|---|---|---|---|
| 10,297,654 | B2 | 5/2019 | Motoyama et al. | |
| 10,340,257 | B2 | 7/2019 | Sung et al. | |
| 10,574,836 | B2 | 2/2020 | Oguchi et al. | |
| 10,665,661 | B2 | 5/2020 | Park et al. | |
| 11,011,724 | B2 | 5/2021 | Lim et al. | |
| 2007/0146608 | A1* | 6/2007 | Jin | G09G 3/3648 349/143 |
| 2008/0259264 | A1* | 10/2008 | Jin | G02F 1/1323 349/146 |
| 2014/0320545 | A1 | 10/2014 | Jeon | |
| 2015/0221710 | A1 | 8/2015 | Motoyama et al. | |
| 2016/0246138 | A1* | 8/2016 | Tang | G02F 1/133711 |
| 2017/0154563 | A1* | 6/2017 | Lin | G09G 3/36 |
| 2017/0345802 | A1 | 11/2017 | Sung et al. | |
| 2018/0308915 | A1 | 10/2018 | Motoyama et al. | |
| 2019/0267443 | A1 | 8/2019 | Motoyama et al. | |
| 2020/0006694 | A1 | 1/2020 | Lim et al. | |
| 2020/0319513 | A1* | 10/2020 | Fattal | G02B 6/0035 |
| 2021/0013275 | A1 | 1/2021 | Kim et al. | |
| 2021/0018773 | A1 | 1/2021 | Woodgate et al. | |
| 2021/0066648 | A1 | 3/2021 | Chung et al. | |
| 2021/0111241 | A1 | 4/2021 | Park et al. | |
| 2021/0217831 | A1 | 7/2021 | Jung et al. | |
| 2021/0234134 | A1 | 7/2021 | Qi et al. | |
| 2021/0390914 | A1* | 12/2021 | Fattal | G02F 1/1323 |
| 2022/0102445 | A1* | 3/2022 | Aurongzeb | H10K 59/50 |
| 2023/0126522 | A1 | 4/2023 | Wu et al. | |
| 2023/0280607 | A1 | 9/2023 | Woodgate et al. | |

FOREIGN PATENT DOCUMENTS

| | | | |
|---|---|---|---|
| KR | 10-2019-0042788 | A | 4/2019 |
| KR | 10-2020-0001694 | A | 1/2020 |
| KR | 10-2020-0048181 | A | 5/2020 |
| KR | 10-2021-0092351 | A | 7/2021 |
| KR | 10-2022-0008699 | A | 1/2022 |
| WO | 2022/014843 | A1 | 1/2022 |

OTHER PUBLICATIONS

International Search Report dated Nov. 14, 2022, issued in International Patent Application No. PCT/KR2022/010928.

* cited by examiner

710

1110

1120

ELECTRONIC DEVICE COMPRISING DISPLAY AND METHOD FOR OPERATING SAME

CROSS-REFERENCE TO RELATED APPLICATION(S)

This application is a continuation application, claiming priority under § 365(c), of an International application No. PCT/KR2022/010928, filed on Jul. 26, 2022, which is based on and claims the benefit of a Korean patent application number 10-2021-0118638, filed on Sep. 6, 2021, in the Korean Intellectual Property Office, the disclosure of which is incorporated by reference herein in its entirety.

BACKGROUND

1. Field

The disclosure relates to an electronic device including a display. More particularly, the disclosure relates to an organic light emitting electronic device that implements a private mode, and a method for operating the same.

2. Description of Related Art

An organic light emitting electronic device that implements a private mode may include wide pixels having a relatively wide viewing angle, and a plurality of narrow pixels having a viewing angle that is smaller than that of the wide pixels.

A private mode panel may be driven in a normal mode and/or a private mode, and the two modes may be driven to be switched dynamically. In the private mode panel, all of the wide pixels and the narrow pixels may be turned on in a normal mode, and only the narrow pixels are turned on and the wide pixels may be turned off in the private mode. Furthermore, in the private mode, the narrow pixels and the wide pixels may be turned on with different brightness.

The private mode panel including the narrow pixels and the wide pixels may obtain a performance of the private mode due to the narrow pixels, but light emission angles of the narrow pixels are small, whereby the viewing angle performance may possibly deteriorate in a normal mode, in which all of the wide pixels and the narrow pixels are operated.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device including a display panel that increases light emission areas of wide pixels and/or narrow pixels at a side viewing angle and/or enhances uniformity of brightness in a range of the side viewing angle when a private mode panel is driven, and a method for operating the same.

Additional aspects will be set forth in part in the description which follows and, in part, will be apparent from the description, or may be learned by practice of the presented embodiments.

In accordance with an aspect of the disclosure, a display device is provided. The display device includes a substrate, a plurality of pixels disposed on the substrate and including a first pixel and a second pixel, a first opaque member located not to overlap a first light emitting area of a first sub-pixel that displays a first color included in the first pixel and to surround a circumference of the first light emitting area, and a second opaque member disposed to overlap at least a portion of a second light emitting area of a second sub-pixel that displays a second color included in the second pixel and to wrap a periphery of the second light emitting area around once by a specific first thickness, wherein the first light emitting area is an area, in which a first electrode of the first sub-pixel and a first organic light emitting layer of the first sub-pixel contact each other, and the first light emitting area includes at least two divided areas, and wherein the second light emitting area is an area, in which a second electrode of the second sub-pixel and a second organic light emitting layer of the second sub-pixel contact each other, and the second pixel does not include an opaque member at a portion, at which the second pixel does not overlap the second light emitting area.

In accordance with another aspect of the disclosure, an electronic device is provided. The electronic device includes a display panel, a communication circuitry, memory, and a processor connected to the display panel, the communication circuitry, and the memory, the display panel includes a first opaque member located not to overlap a first light emitting area of a first sub-pixel that displays a first color included in the first pixel and to surround a circumference of the first light emitting area, and a second opaque member disposed to overlap at least a portion of a second light emitting area of a second sub-pixel that displays a second color included in the second pixel and to wrap a periphery of the second light emitting area around once by a specific first thickness, wherein the first light emitting area is an area, in which a first electrode of the first sub-pixel and a first organic light emitting layer of the first sub-pixel contact each other, and the first light emitting area includes at least two divided areas, and wherein the second light emitting area is an area, in which a second electrode of the second sub-pixel and a second organic light emitting layer of the second sub-pixel contact each other, and the second pixel does not include an opaque member at a portion, at which the second pixel does not overlap the second light emitting area.

Another aspect of the disclosure is to provide an electronic device including a display that compensate for loss due to narrow pixels of a private mode by increasing light emission areas of wide pixels and/or narrow pixels at a side viewing angle and showing a higher brightness when a private mode panel is driven, and a method for operating the same.

Another aspect of the disclosure is to provide an electronic device including a display panel that increases light emission areas of wide pixels and/or narrow pixels at a side viewing angle and enhances uniformity of brightness in a range of the side viewing angle when a private mode panel is driven, and a method for operating the same.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that the blocks in each flowchart and combinations of the flowcharts may be performed by one or more computer programs which include instructions. The entirety of the one or more computer programs may be stored in a single memory or the one or more computer programs may be divided with different portions stored in different multiple memories, Any of the functions or operations described herein can be processed by one processor or a combination of processors. The one processor or the combination of processors is circuitry performing processing and includes circuitry like an application processor (AP, e.g. a central processing unit (CPU)), a communication processor (CP, e.g., a modem), a graphical processing unit (GPU), a neural processing unit (NPU) (e.g., an artificial intelligence (AI) chip), a Wi-Fi chip, a Bluetooth® chip, a global positioning system (GPS) chip, a near field communication (NFC) chip, connectivity chips, a sensor controller, a touch controller, a finger-print sensor controller, a display drive integrated circuit (IC), an audio CODEC chip, a universal serial bus (USB) controller, a camera controller, an image processing IC, a microprocessor unit (MPU), a system on chip (SoC), an integrated circuit (IC), or the like.

Figure 1:
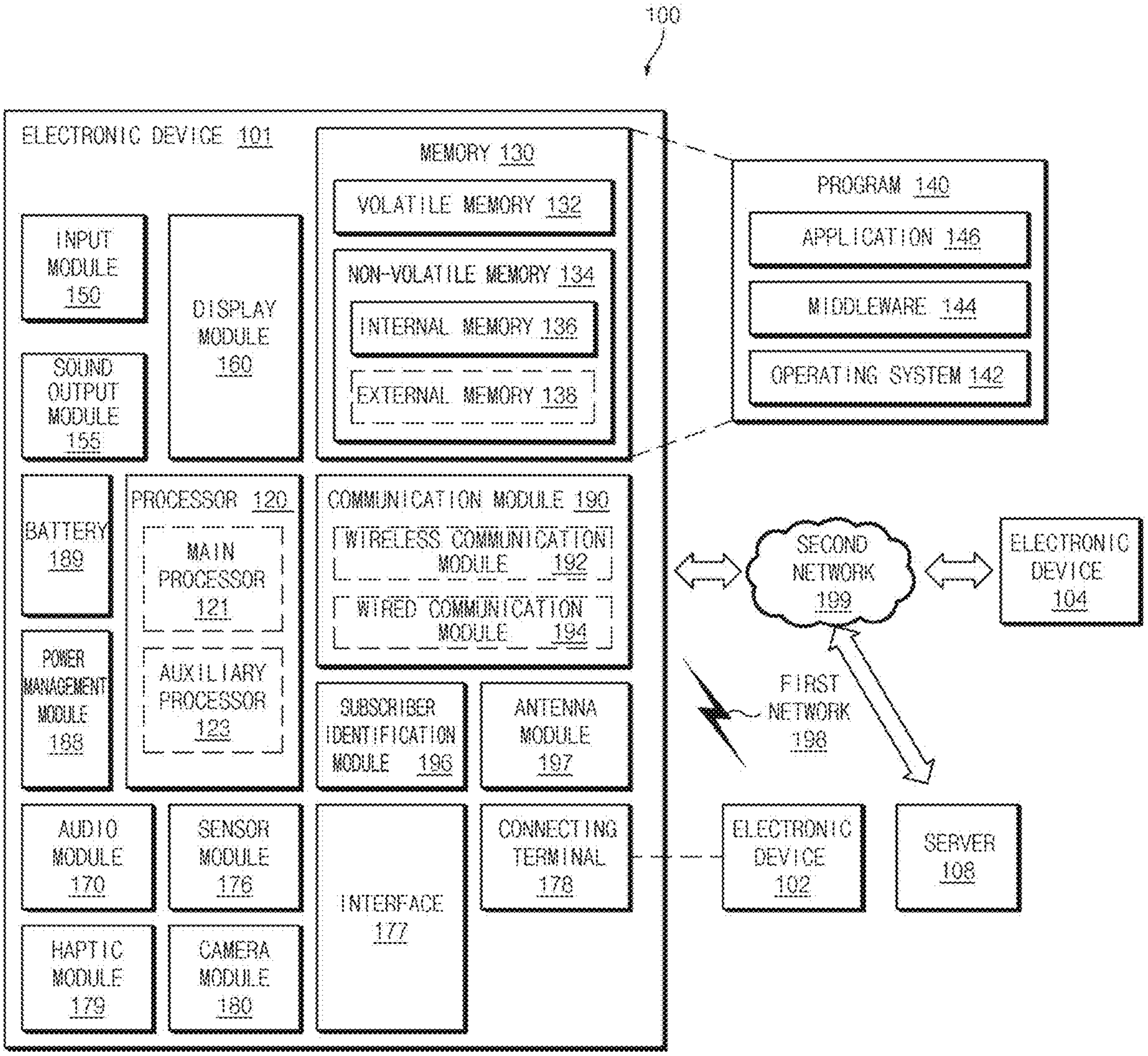
FIG. 1 is a block diagram illustrating an electronic device in a network environment, according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190 (e.g., a communication circuitry), a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) are implemented as embedded in the display device 160 (e.g., a display).

The processor 120 executes, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data includes, for example, software (e.g., the program 140) and input data or output data for a command related thereto. The memory 130 may include the volatile memory 132 or the non-volatile memory 134. The non-volatile memory 134 may include an internal memory 136 or external memory 138.

The program 140 may be stored in the memory 130 as software, and includes, for example, an operating system (OS) 142, middleware 144, or an application 146.

The input device 150 may receive a command or data to be used by other components (e.g., the processor 120) of the electronic device 101, from the outside (e.g., a user) of the electronic device 101. The input device 150 includes, for example, a microphone, a mouse, a keyboard, or a digital pen (e.g., a stylus pen).

The sound output device 155 may output sound signals to the outside of the electronic device 101. The sound output device 155 includes, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 includes, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 includes, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 includes, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 includes, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 includes, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 includes, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a fifth generation (5G) network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter wave (mmWave band)) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 gigabits per second (Gbps) or more) for implementing eMBB, loss coverage (e.g., 164 dB or less) for implementing mMTC, or U-plane latency (e.g., 0.5 milliseconds (ms) or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element implemented using a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to certain embodiments, the antenna module 197 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102 or 104, or the server 108. For example, if the electronic device 101 should perform a function or a service automatically, or in response to a request from a user or another device, the electronic device 101, instead of, or in addition to, executing the function or the service, requests the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology is used, for example. The electronic device 101 may provide ultra-low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices includes, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module is implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) invokes at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
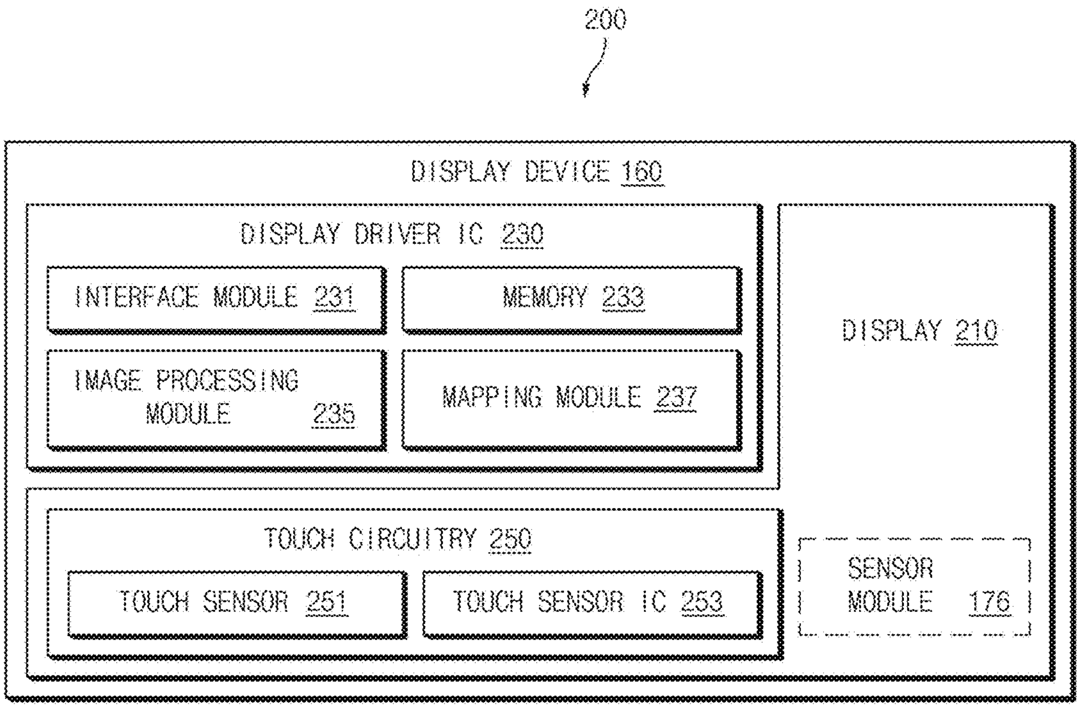
FIG. 2 is a block diagram of a display module, according to an embodiment of the disclosure.

FIG. 2 is a block diagram of the display module, according to an embodiment of the disclosure.

Referring to FIG. 2, in a block diagram 200, the display module 160 may include a display 210 and a display driver IC (DDI) 230 to control the display 210. The DDI 230 may include an interface module 231, memory 233 (e.g., buffer memory), an image processing module 235, or a mapping module 237. The DDI 230 may receive image information including, for example, image data or an image control signal corresponding to a command for controlling image data, from another component of the electronic device 101 through the interface module 231. For example, according to an embodiment, the image information is received from the processor 120 (e.g., the main processor 121 (e.g., an application processor) or the auxiliary processor 123 (e.g., the graphic processing device) operated independently from the function of the main processor 121). The DDI 230 may make communication with a touch circuit 250 or the sensor module 176 through the interface module 231. The DDI 230 may store at least some of the received image information in the memory 233, for example, in unit of a frame. The image processing module 235 may perform pretreatment or post-treatment (e.g., adjusting a resolution, a brightness, or a size), with respect to, for example, at least some of the image data based at least on the characteristic of the image data or the characteristic of the display 210. The mapping module 237 may generate a voltage value or a current value corresponding to the image data subject to the pretreatment or the post-treatment through the image processing module 235. According to an embodiment, the voltage value and the current value may be generated based at least partially on attributes (e.g., the array (red green blue (RGB) stripe or pentile structure) of pixels or the size of each sub-pixel) of the display 210. At least some pixels of the display 210 may be driven based at least partially on, for example, the voltage value or the current value, such that visual information (e.g., a text, an image, or an icon) corresponding to the image data is displayed through the display 210.

According to an embodiment, the display module 160 may further include the touch circuit 250. The touch circuit 250 may include a touch sensor 251 and a touch sensor IC 253 for controlling the touch sensor 251. For example, the touch sensor IC 253 controls the touch sensor 251 to sense the touch input or the hovering input to a specified position of the display 210. For example, the touch sensor IC 253 senses a touch input or a hovering input by measuring the change in the signal (e.g., a voltage, a light quantity, a resistance, or a charge amount) at a specific position of the display 210. The touch sensor IC 253 may provide, to the processor 120, information (e.g., a position, an area, pressure, or a time) on the sensed touch input or hovering input. According to an embodiment, at least a portion (e.g., the touch sensor IC 253) of the touch circuit 250 may be included in a portion of the display driver IC 230 or the display 210, or a portion of another component (e.g., the auxiliary processor 123) disposed outside the display module 160.

According to an embodiment, the display module 160 may further include at least one sensor (e.g., a fingerprint sensor, an iris sensor, a pressure sensor, or an illuminance sensor) of the sensor module 176 or a control circuit for the at least one sensor. In this case, the at least one sensor or the control circuit for the at least one sensor may be embedded in a portion (e.g., the display 210 or the DDI 230) of the display module 160 or a portion of the touch circuit 250. For example, when the sensor module 176 embedded in the display module 160 includes a biometric sensor (e.g., a fingerprint sensor), the biometric sensor obtains biometric information (e.g., a fingerprint image) associated with a touch input through a partial area of the display 210. For another example, when the sensor module 176 embedded in the display module 160 includes a pressure sensor, the pressure sensor obtains input information associated with the touch input through a partial area or the whole area of the display 210. According to an embodiment, the touch sensor 251 or the sensor module 176 may be disposed between pixels provided in a pixel layer or disposed on or under the pixel.

An electronic device according to an embodiment will be described with reference to FIGS. 3 and 4.

Figure 3:
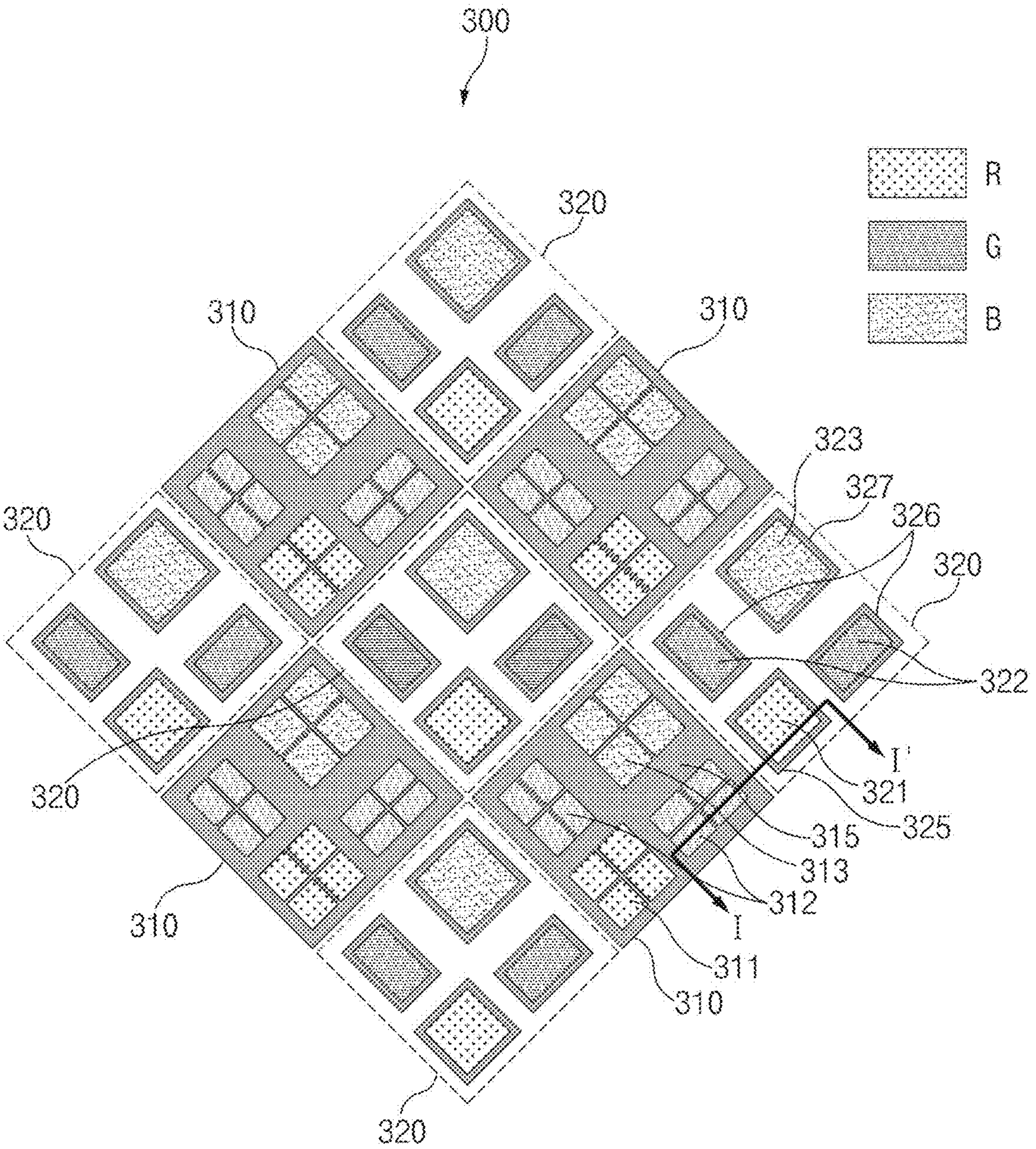
FIG. 3 is a plan view illustrating an organic light emitting electronic device included in an electronic device according to a first embodiment (case "A") of the disclosure.

FIG. 3 is a plan view illustrating an organic light emitting electronic device included in an electronic device according to a first embodiment (case "A") of the disclosure.

FIG. 3 illustrates appearances of a plurality of pixels and light shielding members of an organic light emitting electronic device, when viewed down from a top.

Figure 4:
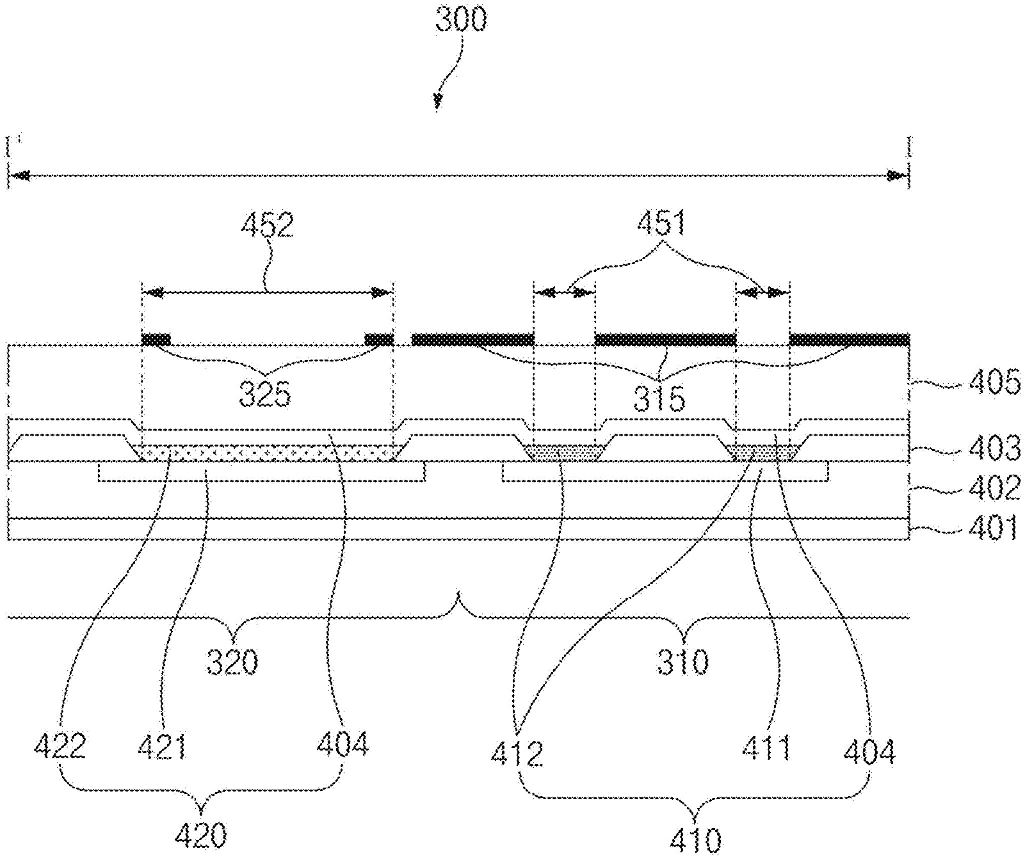
FIG. 4 is a cross-sectional view taken along line I-I' of FIG. 3 according to an embodiment of the disclosure.

FIG. 4 is a cross-sectional view taken along line I-I' of FIG. 3 according to an embodiment of the disclosure. The same configurations as those of the above-described embodiments may be referenced by the same reference numerals.

Referring to FIG. 3, an organic light emitting electronic device 300 included in an electronic device (e.g., the electronic device 101) according to an embodiment may include a plurality of pixels 310 and 320. The plurality of pixels 310 and 320 may include a plurality of wide pixels 320, and a plurality of narrow pixels 310 having a viewing angle that is smaller than that of the wide pixels. According to another embodiment, the organic light emitting electronic device 300 may be an AMOLED private mode panel.

According to yet another embodiment, the AMOLED private mode panel may be driven in a normal mode and/or a private mode, and the two modes may be driven to be switched dynamically. According to yet another embodiment, in the organic light emitting electronic device 300, all of the wide pixels 320 and the narrow pixels 310 may be turned on in the normal mode, and only the narrow pixels 310 may be turned on and the wide pixels 320 may be turned off in the private mode. Furthermore, in the private mode, the narrow pixels 310 and the wide pixels 320 may be turned on with different brightness.

According to yet another embodiment, each of the plurality of pixels 310 and 320 may include a plurality of sub-pixels 311, 312, 313, 321, 322, and 323. Each of the plurality of sub-pixels 311, 312, 313, 321, 322, and 323 may be any one of a red pixel "R", a green pixel "G", and a blue pixel "B". Each of the plurality of pixels 310 and 320 may include one or more red pixels "R", one or more green pixels "G", and one or more blue pixels "B". According to yet another embodiment, the wide pixels 320 may include the red pixel 321, the two green pixels 322, and the blue pixel 323. According to yet another embodiment, the narrow pixels 310 may include the red pixel 311, the two green pixels 312, and the blue pixel 313.

Referring to FIGS. 3 and 4, according to yet another embodiment, each of the plurality of sub-pixels 311, 312, 313, 321, 322, and 323 may include organic light emitting elements 410 and 420. According to yet another embodiment, the organic light emitting electronic device 300 may include a substrate 401, a circuit part, an insulation layer 402, the first organic light emitting element 410, the second organic light emitting element 420, a pixel definition layer (PDL) 403, and a sealing part 405.

The substrate 401 may be an insulating substrate including glass, a polymer, and the like. The substrate 401 may be flexible, stretchable, foldable, bendable, or rollable.

The circuit part may include a pixel circuit including wiring lines such as one or more scan lines, data lines, driving power lines, common power lines, and the like, and two or more thin film transistors (TFT) and one or more capacitors connected to the wiring lines in correspondence to one pixel, and the like, located on the substrate 401. The circuit part may be formed to have various known structures. The pixels 310 and 320 may mean minimum units for displaying an image and the sizes of the pixels may correspond to the sizes of openings formed in the pixel definition layer 430, but the disclosure is not limited thereto.

The insulation layer 402 may be located between the substrate 401, and a first anode electrode 411 and a second anode electrode 421, and the first anode electrode 411 and the second anode electrode 421 may be connected to the circuit part through contact holes formed in the insulation layer 402. The insulation layer 402 may have a monolayered or multilayered structure including one or more of inorganic materials or organic materials, such as a silicon nitride or a silicon oxide, or the like.

The first organic light emitting element 410 may be located on the substrate 401, and may include the first anode electrode 411, a first organic light emitting layer 412, and a cathode electrode 404.

The first anode electrode 411 may be connected to the thin film transistor of the circuit part located on the substrate 401. The first anode electrode 411 may be located to be spaced apart from the second anode electrode 421. An area of the first anode electrode 411 may be opened by the pixel definition layer 403. The first anode electrode 411 may include at least one of a light transmitting electrode, a light semi-transmitting electrode, or a light reflecting electrode.

The first organic light emitting layer 412 may be located in a pixel area defined by the pixel definition layer 403, and may be located on the first anode electrode 411. According to yet another embodiment, the pixel definition layer 403 may have an opening that exposes at least a portion of the anode electrodes 411 and 421, and the opening may correspond to light emitting areas 451 and 452. The organic light emitting layers 412 and 422 may be located in the openings of the pixel definition layer 403.

The first organic light emitting layer 412 may emit light having a wavelength that is different from or the same as that of the second organic light emitting layer 422. According to yet another embodiment, the first organic light emitting layer 412 may emit light of a color that is different from that of the second organic light emitting layer 422. For example, the first organic light emitting layer 412 includes a material that emits green light, and the first organic light emitting layer 412 may emit light of green light. That is, the sub-pixel 312 may emit green light. The disclosure is not limited thereto, and the first organic light emitting layer 412 may include a material that emits light, such as red light, blue light, or white light, and the first light emitting area 451 may emit light, such as red light, blue light, or white light.

The cathode electrode 404 may be located on the first organic light emitting layer 412, the second organic light emitting layer 422, and the pixel definition layer 403 over an entire surface of the substrate 401. The cathode electrode 404 may be formed of a light transmitting electrode or a light semi-transmitting electrode. The cathode electrode 404 may contact the sealing part 405. However, the disclosure is not limited thereto, and the cathode electrode 404 may be spaced apart from the sealing part 405, and a capping layer may be located between the cathode electrode 404 and the sealing part 405.

According to yet another embodiment, the first light emitting area 451 of the first organic light emitting element 410 may mean an area, in which the first anode electrode 411 and the first organic light emitting layer 412 contact each other while another layer (e.g., the pixel definition layer 403) not being interposed therebetween. According to yet another embodiment, the first light emitting area 451 may mean an area, in which the first anode electrode 411 is exposed through the opening of the pixel definition layer 403. According to yet another embodiment, the first light emitting area 451 may be an area, in which the first anode electrode 411 is exposed through the opening of the pixel definition layer 403 such that light is emitted from the first organic light emitting layer 412. According to yet another embodiment, the first light emitting area 451 may correspond to one sub-pixel 312. According to yet another embodiment, the first light emitting area 451 may include at least two divided areas. For example, the first light emitting area 451 includes four divided areas.

The second organic light emitting element 420 may be located on the substrate 401, and may be spaced apart from the first organic light emitting element 410. The second organic light emitting element 420 may include the second anode electrode 421, the second organic light emitting layer 422, and the cathode electrode 404.

The second anode electrode 421 may be located on the circuit part located on the substrate 401, and may be connected to the thin film transistor of the circuit part. An area of the second anode electrode 421 may be opened by an opening corresponding to a pixel area defined by the pixel definition layer 403. The second anode electrode 421 may include at least one of a light transmitting electrode, a light semi-transmitting electrode, or a light reflecting electrode.

The second organic light emitting layer 422 may be located in a pixel area defined by the pixel definition layer 403, and may be located on the second anode electrode 421. According to yet another embodiment, the pixel definition layer 403 may have an opening that exposes at least a portion of the anode electrodes 411 and 421, and the opening may correspond to the light emitting areas 451 and 452. The organic light emitting layers 412 and 422 may be located in the openings of the pixel definition layer 403. The second organic light emitting layer 422 may be located on a portion of the second anode electrode 421 and the pixel definition layer 403.

The second organic light emitting layer 422 may emit light having a wavelength that is different from or the same as that of the first organic light emitting layer 412. The second organic light emitting layer 422 may emit light having a color that is different from that of the first organic light emitting layer 412. For example, the second organic light emitting layer 422 includes a material that emits red light, and the second organic light emitting layer 422 may emit light of red light. That is, the sub-pixel 321 may emit red light. The disclosure is not limited thereto, and the second organic light emitting layer 422 may include a material that emits light, such as green light, blue light, or white light, and the second light emitting area 452 may emit light, such as green light, blue light, or white light.

According to yet another embodiment, the second light emitting area 452 of the second organic light emitting element 420 may mean an area, in which the second anode electrode 421 and the second organic light emitting layer 422 contact each other while another layer (e.g., the pixel definition layer 403) not being interposed therebetween. According to yet another embodiment, the second light emitting area 452 may mean an area, in which the second anode electrode 421 is exposed through the opening of the pixel definition layer 403. According to yet another embodiment, the second light emitting area 452 may be an area, in which the second anode electrode 421 is exposed through the opening of the pixel definition layer 403 such that light is emitted from the second organic light emitting layer 422. According to yet another embodiment, the second light emitting area 452 may correspond to one sub-pixel 321. According to yet another embodiment, the second light emitting area 452 may be one area that is not divided unlike the first light emitting area 451.

The pixel definition layer 403 may be located on the first anode electrode 411 and the second anode electrode 421, and may overlap peripheries of the first anode electrode 411 and the second anode electrode 421. The pixel definition layer 403 may overlap the peripheries of the plurality of anode electrodes 411 and 421, and may define a pixel area. The pixel definition layer 403 may overlap the periphery of the first anode electrode 411 and may define an opening, through which the first anode electrode 411 is exposed. The first anode electrode 411 exposed through the pixel definition layer 403 may correspond to the first light emitting area 451. According to yet another embodiment, in the narrow pixel 310, the pixel definition layer 403 may be disposed on the first anode electrode 411 to overlap a center of the first anode electrode 411 and have a cross shape. According to yet another embodiment, the pixel definition layer 403 may be disposed such that the first light emitting area 451 has at least two divided areas. For example, the pixel definition layer 403 is disposed such that the first light emitting area 451 has four divided areas.

The pixel definition layer 403 may overlap the periphery of the second anode electrode 421 and may define an opening, through which the second anode electrode 421 is exposed. The second anode electrode 421 exposed through the pixel definition layer 403 may correspond to the second light emitting area 452. Unlike the first light emitting area 451, the second light emitting area 452 may not be divided into a plurality of areas, and may be one area.

According to yet another embodiment, the openings defined by the pixel definition layer 403 may have a polygonal shape on a plane, and may have a polygonal shape, such as a four-sided shape, a triangular shape, a pentagonal shape, a hexagonal shape, a heptagonal shape, or an octagonal shape. According to yet another embodiment, the openings of the pixel definition layer 403 corresponding to the sub-pixels included in the narrow pixel may have a window shape having a cross-shaped window frame.

The pixel definition layer 403 may have the openings having different sizes according to colors of light emitted by the sub-pixels. As an example, the opening of the green sub-pixel is smaller than the opening of the red sub-pixel, and the opening of the red sub-pixel may be smaller than the opening of the blue sub-pixel. However, the disclosure is not limited thereto, and the openings may have different sizes or all of the openings may have the same size.

The sealing part 405 may be located on the first organic light emitting element 410 and the second organic light emitting element 420. The sealing part 405 may seal the first organic light emitting element 410 and the second organic light emitting element 420 together with the substrate 401. The sealing part 405 may include at least one organic layer and at least one inorganic layer. The at least one organic layer and the at least one inorganic layer may be laminated alternately.

Light shielding members 315, 325, 326, and 327 may be located on the sealing part 405. According to yet another embodiment, the narrow pixels 310 may be located such that the first light shielding member 315 overlaps all portions of the narrow pixels 310, except for the light emitting areas, to show a narrow viewing angle effect. For example, the first light shielding member 315 is located to surround circumferences of the plurality of sub-pixels 311, 312, and 313 included in the narrow pixels 310. That is, the first light shielding member 315 may be located to surround circumferences of the red pixel 311, the two green pixels 312, and the blue pixel 313 of the narrow pixels. Furthermore, the first light shielding member 315 may be located to overlap the centers of the sub-pixels 311, 312, and 313 and to have a cross-shape. The first light shielding member 315 may at least partially overlap the pixel definition layer 403 corresponding to the narrow pixels 310. Because the first light shielding member 315 is located to overlap all portions of the narrow pixels 310, except to the light emitting areas, the first light shielding member 315 may interrupt wide-angle emission of light of narrow pixels 310.

According to yet another embodiment, the first light shielding member 315 may not overlap the light emitting areas of the narrow pixels 310. For example, according to yet another embodiment, the first light shielding member 315 does not overlap the first light emitting area 451 of the narrow pixels 310.

According to yet another embodiment, the second light shielding member 325, the third light shielding member 326, and the fourth light shielding member 327 may be located to at least partially overlap the light emitting areas of the plurality of sub-pixels 321, 322, and 323 included in the wide pixels 320. In particular, the second light shielding member 325, the third light shielding member 326, and the fourth light shielding member 327 may overlap the light emitting areas to have a specific thickness toward insides of the light emitting areas at borders of the light emitting areas of the plurality of sub-pixels 321, 322, and 323 included in the wide pixel 320 and the pixel definition layer 403 and to wrap the peripheries of the light emitting areas around once.

In particular, the second light shielding member 325, the third light shielding member 326, and the fourth light shielding member 327 may overlap the light emitting areas to have a specific thickness toward insides of the second light emitting areas at borders of the light emitting areas of the plurality of sub-pixels 321, 322, and 323 included in the wide pixel 320 and the pixel definition layer 403 and to wrap the peripheries of the light emitting areas around once. That is, the second light shielding member 325 may be located to overlap peripheral area of the second light emitting area 452 of the red pixel 321 included in the wide pixels 320.

The third light shielding member 326 may overlap the light emitting area to have a specific thickness toward the light emitting area at borders of the light emitting area of the green pixel 322 included in the wide pixel 320 and the pixel definition layer 403 and to wrap the periphery of the light emitting area around once. That is, the third light shielding member 326 may be located to overlap a peripheral area of the light emitting area of the green pixel 322 included in the wide pixel 320. The fourth light shielding member 327 may overlap the light emitting area to have a specific thickness toward the light emitting area at borders of the light emitting areas of the blue pixel 323 included in the wide pixel 320 and the pixel definition layer 403 and to wrap the periphery of the light emitting area around once. That is, the fourth light shielding member 327 may be located to overlap a peripheral area of the light emitting area of the blue pixel 323 included in the wide pixel 320.

The second light shielding member 325, the third light shielding member 326, and the fourth light shielding member 327 may not be located at portions that deviate from the light emitting areas. Because the second light shielding member 325, the third light shielding member 326, and the fourth light shielding member 327 may not be located at portions that deviate from the light emitting areas, the wide pixels may perform wide-angle light emission.

According to yet another embodiment, a private mode panel including the narrow pixels 310 and the wide pixels 320 may obtain a performance of the private mode due to the narrow pixels, but light emission angles of the narrow pixels are small, whereby the viewing angle performance may be deteriorated in a normal mode, in which all of the wide pixels and the narrow pixels are operated. Accordingly, there is a need to increase the light emission angles of the wide pixels, and the embodiments described above with reference to FIGS. 3 and 4 may compensate for losses due to the narrow pixels as the light emission angles of the wide pixels are increased at a viewing angle (that means, for example, more than 0 degrees and less than 90 degrees when it is 0 degrees (°) when the organic light emitting electronic device is viewed from the front side) that is more oblique than the conventional wide pixels and thus a higher brightness is shown.

A first embodiment (case "A") illustrated in FIGS. 3 and 4 and a second embodiment (case "B") for the conventional private mode panel will be compared and described with reference to FIGS. 5, 6, and 7.

FIGS. 5A, 5B, 6A, and 6B are views illustrating a cross-section of a wide pixel according to a first embodiment (case "A") and a cross-section of a wide pixel according to a second embodiment (case "B") in comparison according to various embodiments of the disclosure.

Figure 7A:
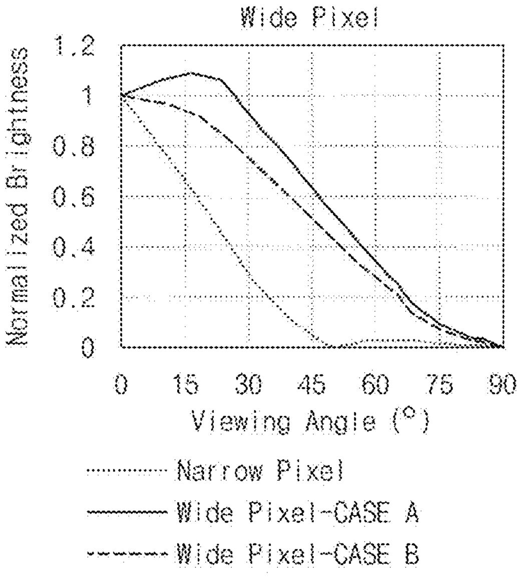
FIGS. 7A and 7B are views illustrating graphs depicting normalized brightness according to viewing angles, which are measured for a first embodiment (case "A") and a second embodiment (case "B") according to various embodiments of the disclosure.
Figure 7B:
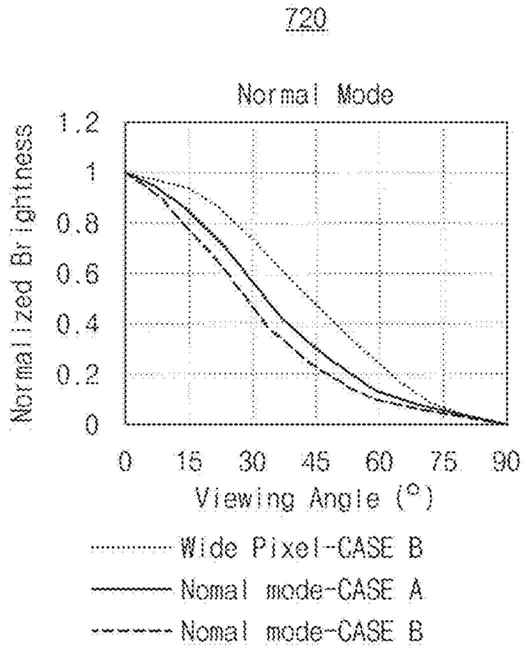

FIGS. 7A and 7B are views illustrating graphs depicting normalized brightness according to viewing angles, which are measured for the first embodiment (case "A") and the second embodiment (case "B") according to various embodiments of the disclosure.

Figure 5A:
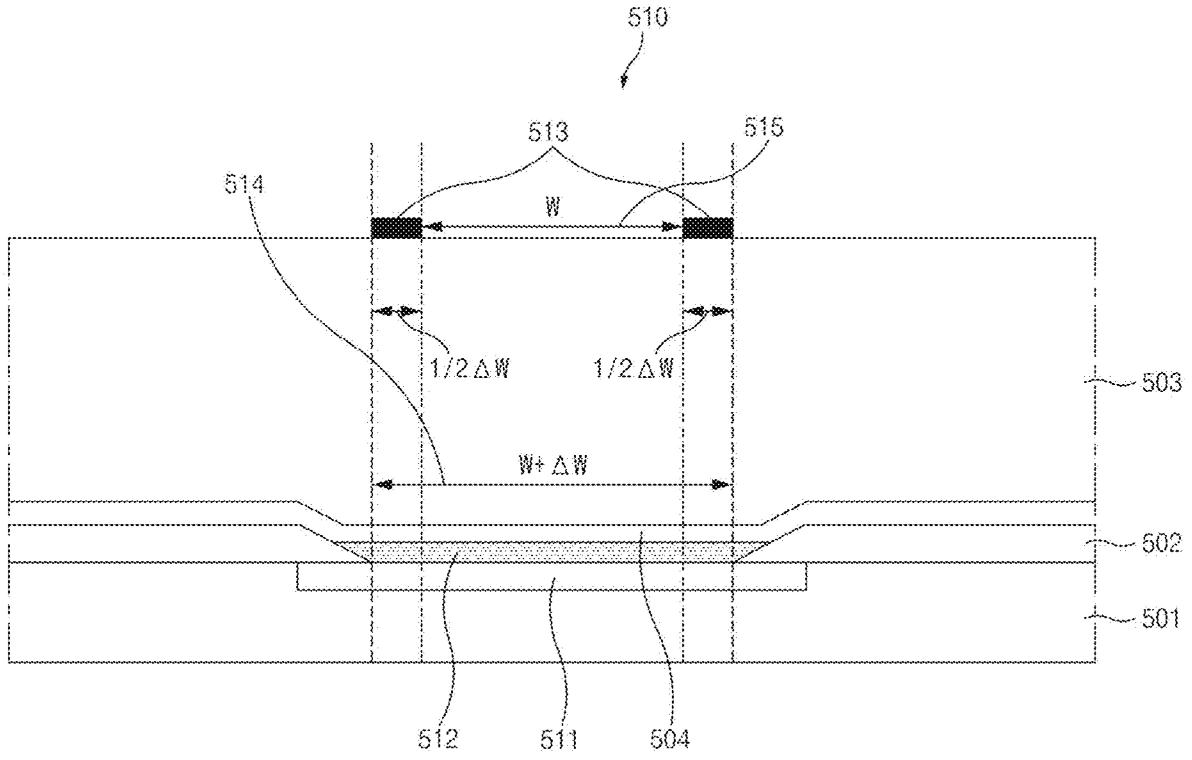
FIGS. 5A, 5B, 6A, and 6B are views illustrating a cross-section of a wide pixel according to a first embodiment (case "A") and a cross-section of a wide pixel according to a second embodiment (case "B") in comparison according to various embodiments of the disclosure.
Figure 5B:
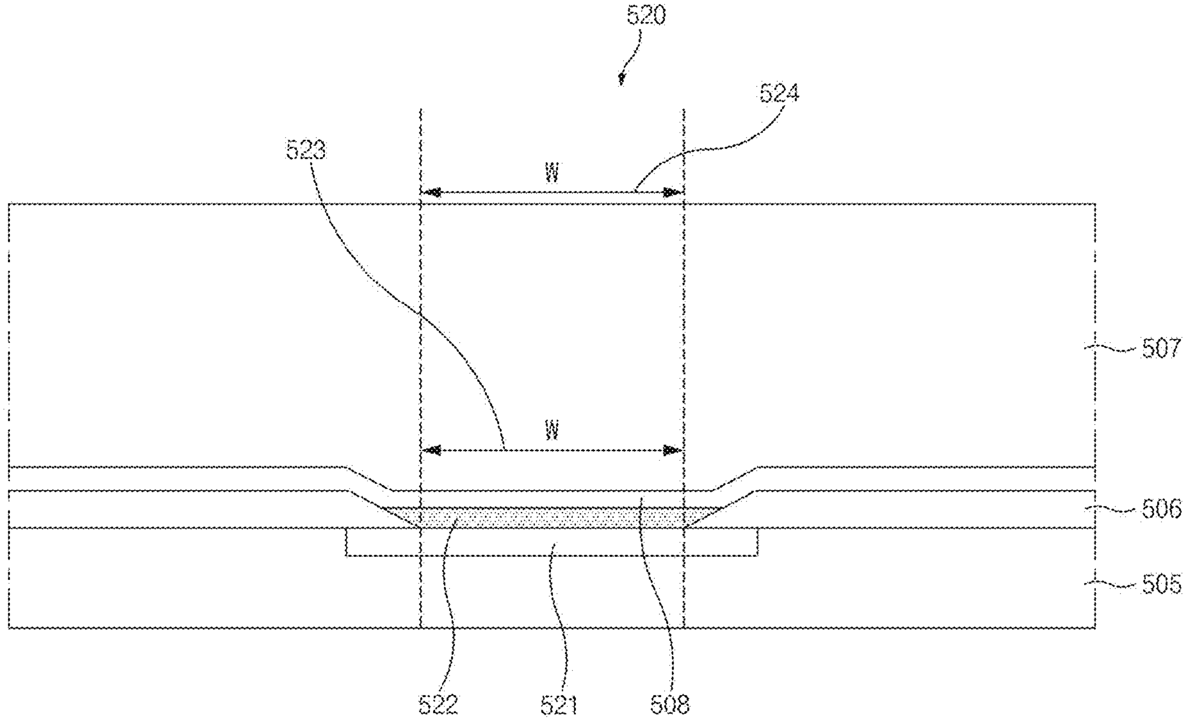

Referring to FIGS. 5A and 5B, a first wide pixel 510 of FIG. 5A illustrates a cross-section of a wide pixel for the first embodiment (case "A") illustrated in FIGS. 3 and 4, and a second wide pixel 520 illustrates a cross-section of a wide pixel for the second embodiment (case "B") that is the conventional private mode panel.

The first wide pixel 510 according to the first embodiment (case "A") may include a substrate 501, a first anode electrode 511, a first organic light emitting element 512, a pixel definition layer 502, a cathode electrode 504, a sealing part 503, and a first light shielding member 513. The substrate 501 may include a circuit part, an insulation layer, and the like, and a description of the substrate 501, the pixel definition layer 502, the cathode electrode 504, and the sealing part 503 may be the same as the description of the embodiments described above with reference to FIGS. 3 and 4.

The second wide pixel 520 according to the second embodiment (case "B") may include a substrate 505, a second anode electrode 521, a second organic light emitting element 522, a pixel definition layer 506, a cathode electrode

508, and a sealing part 507. The substrate 505 may include a circuit part, an insulation layer, and the like, and a description of the substrate 505, the pixel definition layer 506, the cathode electrode 508, and the sealing part 507 may be the same as the description of the embodiments described above with reference to FIGS. 3 and 4.

An area of the first anode electrode 511 of the first wide pixel 510 according to the first embodiment (case "A") may be larger than an area "W" of the second anode electrode 521 of the second wide pixel 520 according to the second embodiment (case "B") by a first area (ΔW). Furthermore, according to an embodiment, an area of the first organic light emitting element 512 may become larger than the second organic light emitting element 522 by the increased first area (ΔW) of the first anode electrode 511.

Furthermore, the first wide pixel 510 according to the first embodiment (case "A") may include the first light shielding member 513 that overlaps the increased first area (ΔW) of the first anode electrode 511. According to another embodiment, as the first anode electrode 511 is widened to opposite sides by a second area (½ΔW), respectively, the area of the first light shielding member 513 may become the second area (½ΔW). According to yet another embodiment, the first light shielding member 513 may be located to at least partially overlap a first light emitting area 514 to have a specific second area (½ΔW) toward an inside of the first light emitting area 514 at a border of the first light emitting area 514 of the first wide pixel 510 and the pixel definition layer 502 and to wrap the periphery of the first light emitting area 514 around once.

In the first wide pixel 510 according to the first embodiment (case "A"), the area of the first light emitting area 514 may become W+ΔW due to the first anode electrode 511, the area of which is increased by the first area (ΔW). However, an area of a first exposed area 515 when the first wide pixel 510 is viewed down vertically from a top may become "W" as the first exposed area 515 is covered by the first light shielding member 513 having the second area (½ΔW).

In the second wide pixel 520 according to the second embodiment (case "B"), an area of a second light emitting area 523 may be "W", and an area of a second exposed area 524 when the second exposed area 524 is viewed down vertically from the top also may be "W" in the same way.

Figure 6A:
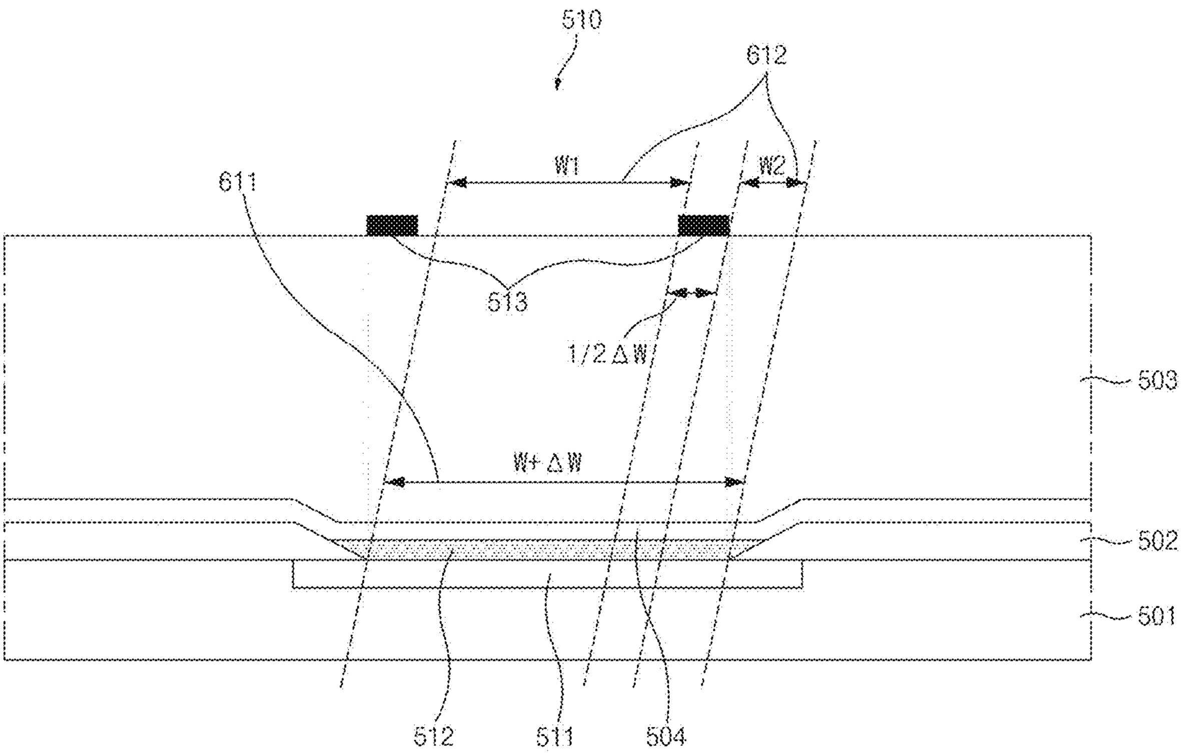
Figure 6B:
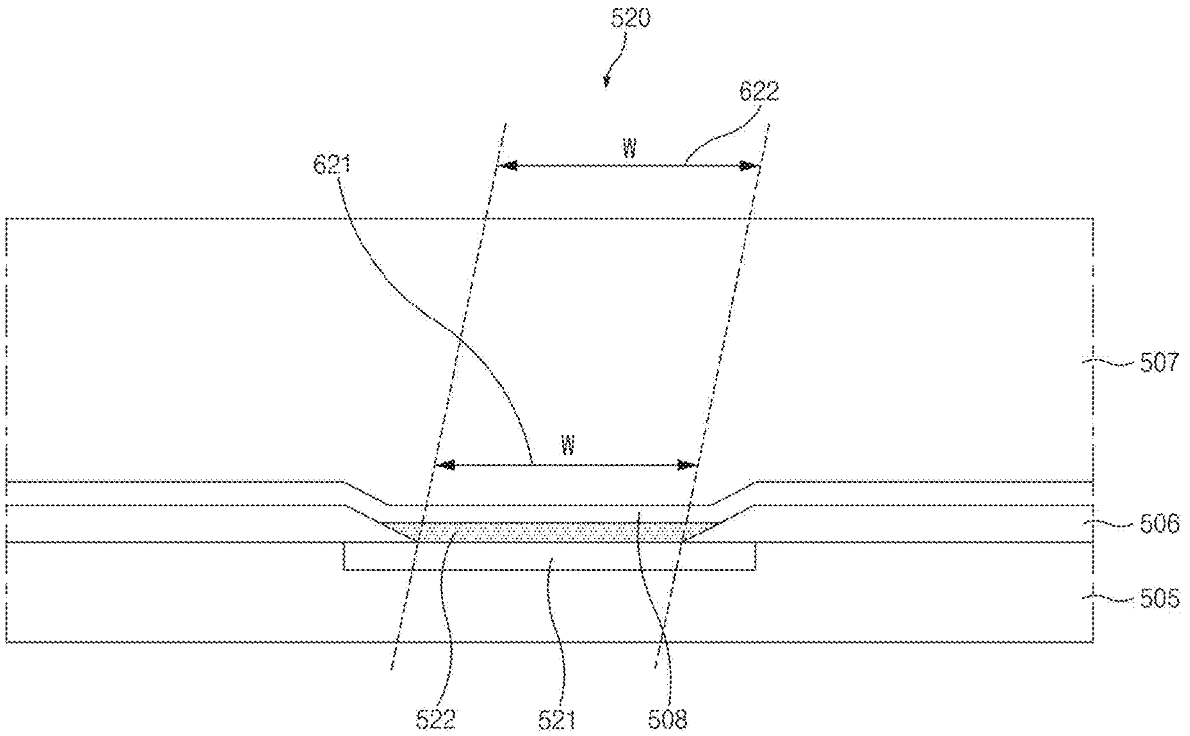

Referring to FIGS. 6A and 6B, FIGS. 6A and 6B are views illustrating the first wide pixel 510 and the second wide pixel 520 that are the same as those of FIGS. 5A and 5B, which are viewed not vertically from a top but at an oblique angle. Even when the second wide pixel 520 is viewed down at the oblique angle, both areas of a second light emitting area 621 and a second exposed area 622 may be "W". However, in the first wide pixel 510, an area of a first light emitting area 611 is W+ΔW and an area of a first exposed area 612 is W1+W2, and may be a value that is obtained by subtracting ½ΔW covered by the first light shielding member 513 from W+ΔW that is the area of the first light emitting area 611. That is, the area of the first exposed area 612 may be W1+W2=W+½ΔW.

Accordingly, in the first embodiment (case "A"), the area of the exposed area of the wide pixel may be larger by ½ΔW at an oblique angle than in the second embodiment (case "B"). Accordingly, in the first embodiment (case "A"), the exposure area of the wide pixel at the oblique viewing angle becomes larger than that of the wide pixel of the second embodiment (case "B") even in the private mode panel including the narrow pixels and the wide pixels whereby a higher brightness is shown so that loss due to the small viewing angle of the narrow pixel may be compensated for in the normal mode, in which both of the wide pixels and the narrow pixels are operated.

Referring to FIGS. 7A and 7B, a first graph 710 and a second graph 720 may be graphs obtained by measuring normalized brightness of pixels according to viewing angles. In the first graph 710 and the second graph 720, case "A" may represent the first embodiment (case "A") including the light shielding member, one end of which coincides with a border of the above-described light emitting area, and case "B" may represent the second embodiment (case "B") that does not include the light shielding member that overlaps the above-described light emitting area. In the first graph 710, the narrow pixels may represent brightness values of only the narrow pixels, and the wide pixels may represent brightness values of only the wide pixels. In the second graph 720, the wide pixel may represent a brightness value of only the wide pixel, and the normal mode may represent an average value of the brightness of the wide pixels and the narrow pixels in the normal mode.

Referring to the first graph 710, it may be identified that the brightness of the wide pixels is higher than the brightness of the narrow pixels and the brightness of the wide pixels is higher in the first embodiment (case "A") including the wide pixels each having the expanded anode electrode and the light shielding member that overlaps the expanded portion of the anode electrode, than in the second embodiment (case "B"). In particular, it may be identified that the difference between the brightness is large at a viewing angle of 0 to 30 degrees (°).

Referring to the second graph 720, it may be identified that the average of the brightness of the wide pixels and the narrow pixels is lower than the brightness of only the wide pixels in the second embodiment (case "B"), in the normal mode, but the average value of the brightness of the wide pixels and the narrow pixels may be higher in the normal mode of the first embodiment (case "A") than in the second embodiment (case "B").

An electronic device according to an embodiment will be described with reference to FIG. 8.

Figure 8:
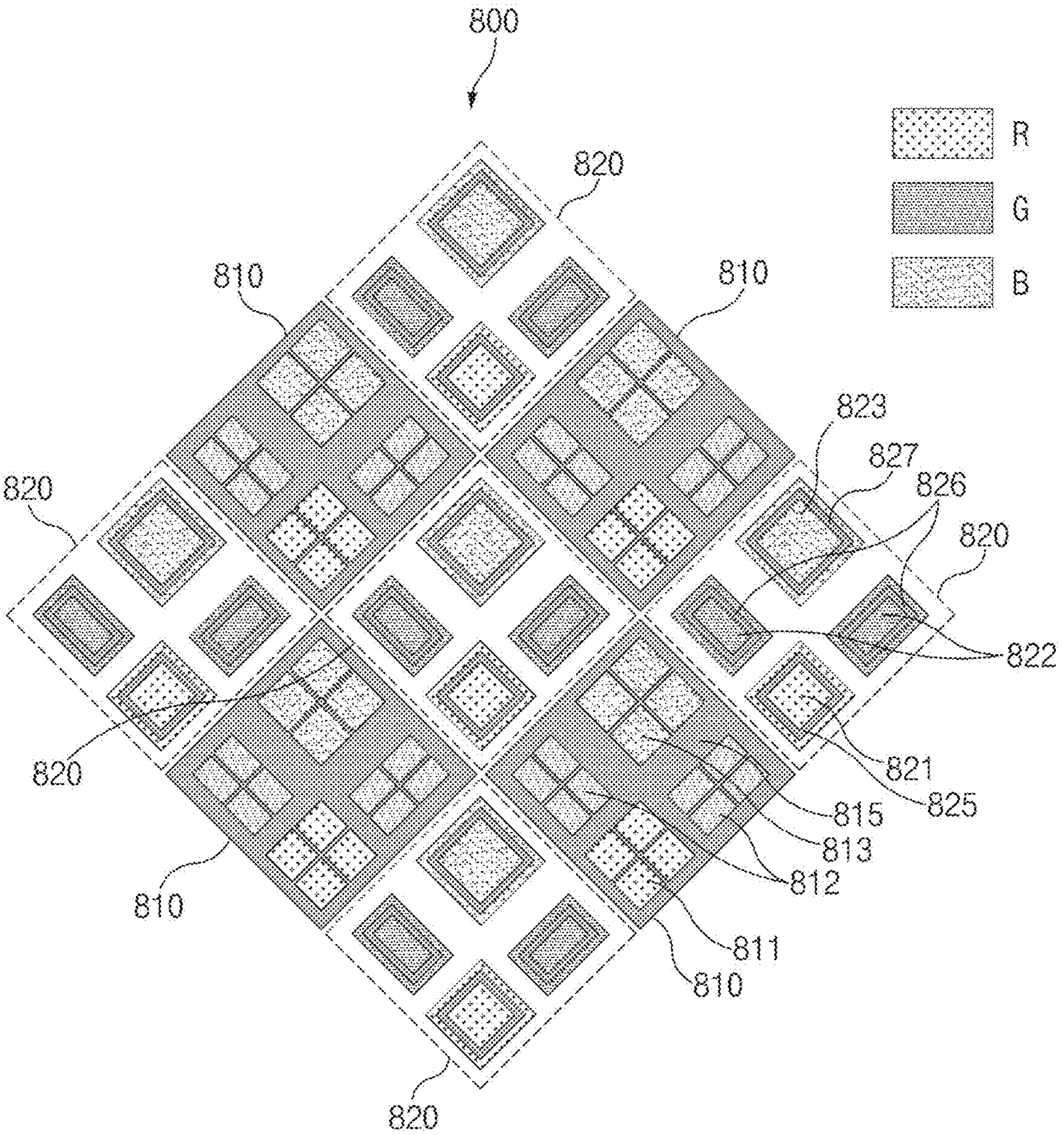
FIG. 8 is a plan view illustrating an organic light emitting electronic device included in an electronic device according to a third embodiment (case "C") of the disclosure.

FIG. 8 is a plan view illustrating an organic light emitting electronic device included in an electronic device according to a third embodiment (case "C") of the disclosure.

Referring to FIG. 8, an organic light emitting electronic device 800 included by an electronic device (e.g., the electronic device 101) according to an embodiment may include a plurality of pixels 810 and 820. The plurality of pixels 810 and 820 may include a plurality of wide pixels 820, and a plurality of narrow pixels 810 having a viewing angle that is smaller than that of the wide pixels. According to another embodiment, each of the plurality of pixels 810 and 820 may include a plurality of sub-pixels 811, 812, 813, 821, 822, and 823. According to yet another embodiment, the organic light emitting electronic device 800 may be an AMOLED private mode panel.

The organic light emitting electronic device 800 according to the third embodiment (case "C") illustrated in FIG. 8 may be the same as the organic light emitting electronic device 300 according to the first embodiment (case "A") illustrated in FIGS. 3, 4, 5, and 6, except for the light shielding members. In a description of the organic light emitting electronic device 800 according to the third embodiment (case "C"), the same description as that of the organic light emitting electronic device 300 according to the first embodiment (case "A") may be omitted.

In the organic light emitting electronic device 800, light shielding members 815, 825, 826, and 827 may be located on a sealing part (not illustrated) that seals organic light emitting elements together with the substrate. According to yet another embodiment, the narrow pixel 810 may be located such that the first light shielding member 815 overlaps all portions of the narrow pixel 810, except for the light emitting area. For example, the first light shielding member 815 may be located to surround circumferences of the plurality of sub-pixels 810, 811, and 812 included in the narrow pixel 810, to overlap the centers of the sub-pixels 811, 812, and 813, and to have a cross shape.

According to yet another embodiment, the second light shielding member 825, the third light shielding member 826, and the fourth light shielding member 827 may be located to at least partially overlap the light emitting areas of the plurality of sub-pixels 821, 822, and 823 included in the wide pixels 820. In particular, the second light shielding member 825, the third light shielding member 826, and the fourth light shielding member 827 may overlap the light emitting areas to be spaced apart from borders of the light emitting areas of the plurality of sub-pixels 821, 822, and 823 included in the wide pixel 820 inwards by a specific thickness and to wrap the peripheries of the light emitting areas around once. Then, thicknesses of the second light shielding member 825, the third light shielding member 826, and the fourth light shielding member 827 may be the same as the thickness, by which they are spaced apart from the borders of the light emitting areas.

According to yet another embodiment, the second light shielding member 825 may overlap the light emitting area to be spaced apart from border of the light emitting area of the red pixel 821 included in the wide pixels 820 inward by a specific thickness and to wrap the periphery of the light emitting area around once. The third light shielding member 826 may overlap the light emitting area to be spaced apart from border of the light emitting area of the green pixel 822 included in the wide pixels 820 inward by a specific thickness and to wrap the periphery of the light emitting area around once. The fourth light shielding member 827 may overlap the light emitting area to be spaced apart from border of the light emitting areas of the blue pixel (i.e., sub-pixel 823) included in the wide pixels 820 inward by a specific thickness and to wrap the periphery of the light emitting area around once.

Referring to FIGS. 9A, 9B, 10A, 10B, 11A, and 11B, a difference between the third embodiment (case "C") and the first embodiment (case "A") and effects of the third embodiment (case "C") will be described in detail.

FIGS. 9A, 9B, 10A, and 10B are views illustrating a cross-section of a wide pixel according to a third embodiment (case "C") and a cross-section of a wide pixel according to a first embodiment (case "A") in comparison according to various embodiments of the disclosure.

Figure 11A:
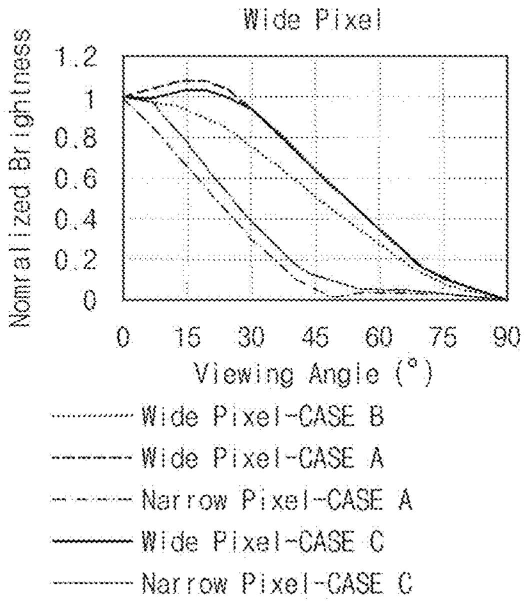
FIGS. 11A and 11B are views illustrating graphs depicting normalized brightness according to viewing angles, which are measured for a first embodiment (case "A"), a second embodiment (case "B"), and a third embodiment (case "C") according to various embodiments of the disclosure.
Figure 11B:
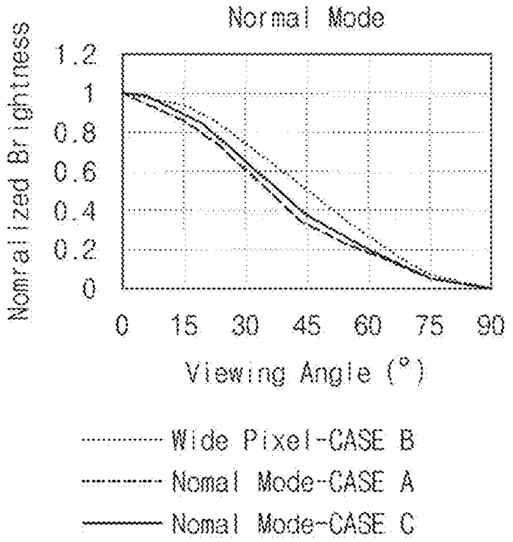

FIGS. 11A and 11B are a view illustrating graphs depicting normalized brightness according to viewing angles, which are measured for a first embodiment (case "A"), a second embodiment (case "B"), and a third embodiment (case "C") according to various embodiments of the disclosure.

The first embodiment (case "A") may mean the first embodiment (case "A") described above with reference to FIGS. 3, 4, 5A, 5B, 6A, 6B, 7A and 7B, and the second embodiment may mean the second embodiment (case "B") described above with reference to FIGS. 5A, 5B, 6A, 6B, 7A, and 7B.

Figure 9A:
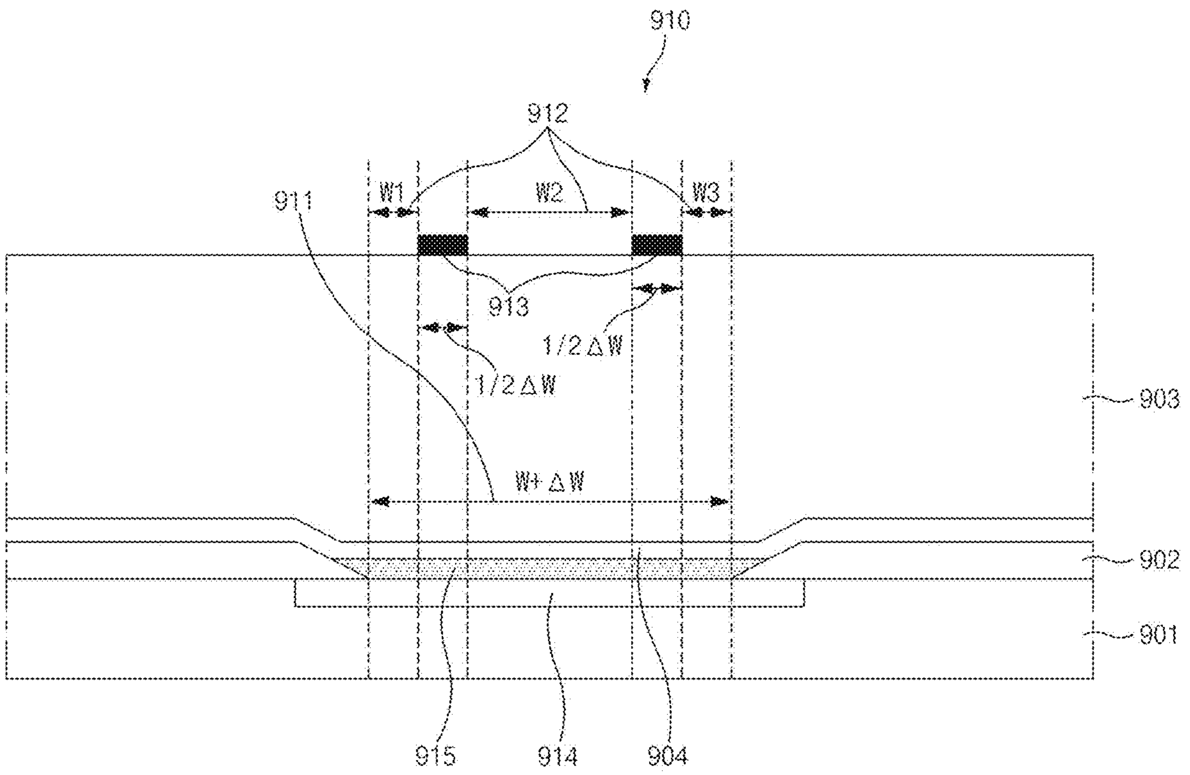
FIGS. 9A, 9B, 10A, and 10B are views illustrating a cross-section of a wide pixel according to a third embodiment (case "C") and a cross-section of a wide pixel according to a first embodiment (case "A") in comparison according to various embodiments of the disclosure.
Figure 9B:
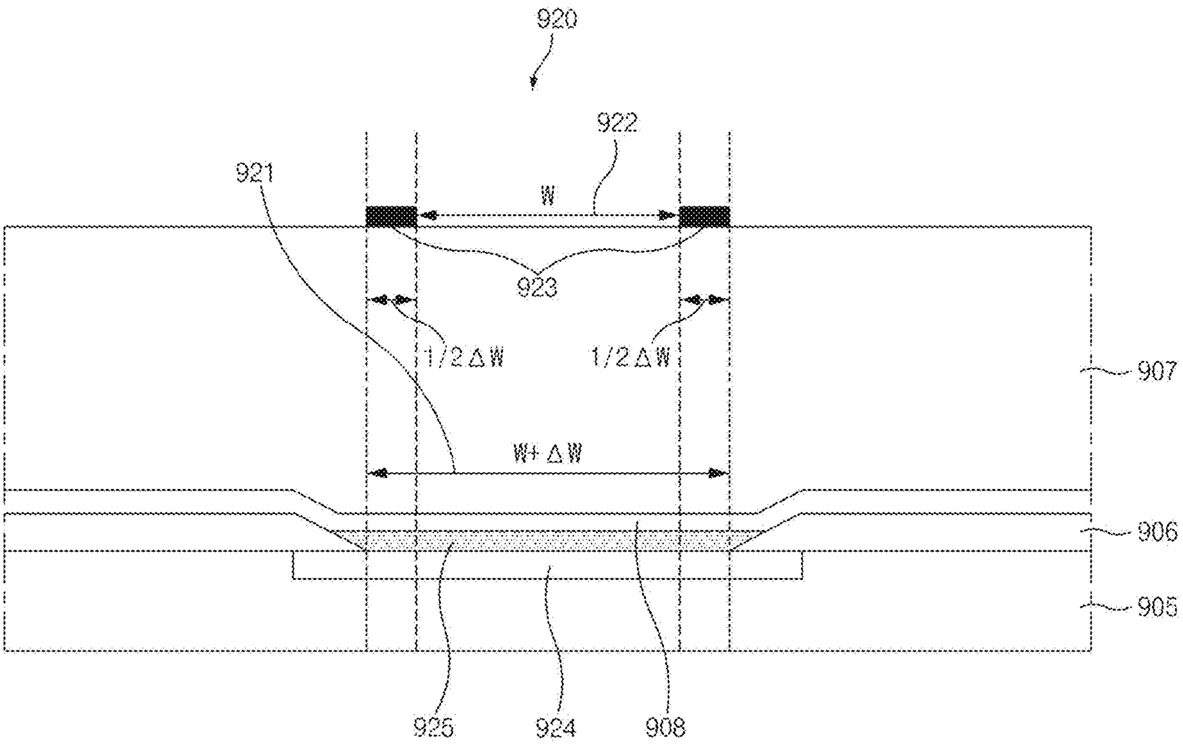

Referring to FIGS. 9A and 9B, a first wide pixel 910 of FIGS. 9A and 9B illustrate a cross-section of a wide pixel for the third embodiment (case "C") illustrated in FIG. 8, and a second wide pixel 920 illustrates a cross-section of a wide pixel for the first embodiment (case "A").

The first wide pixel 910 according to the third embodiment (case "C") may include a substrate 901, a first anode electrode 914, a first organic light emitting layer 915, a pixel definition layer 902, a cathode electrode 904, a sealing part 903, and a first light shielding member 913. The substrate 901 may include a circuit part, an insulation layer, and the like, and a description of the substrate 901, the pixel definition layer 902, the cathode electrode 904, and the sealing part 903 may be the same as the description of the configurations of the same name described above.

The second wide pixel 920 according to the first embodiment (case "A") may include a substrate 905, a second anode electrode 924, a second organic light emitting element 925, a pixel definition layer 906, a cathode electrode 908, and a sealing part 907. The substrate 905 may include a circuit part, an insulation layer, and the like, and a description of the substrate 905, the pixel definition layer 906, the cathode electrode 908, and the sealing part 907 may be the same as the description of the configurations of the same name described above.

The first wide pixel 910 according to the third embodiment (case "C") may include the first light shielding member 913, and the first light shielding member 913 may be located on the sealing part 903 and may at least partially overlap a first light emitting area 911.

According to an embodiment, the pixel definition layer 902 may have an opening that exposes at least a portion of the first anode electrode 914 to define a pixel area, and the opening may correspond to the first light emitting area 911. The first organic light emitting layer 915 may be located in the openings of the pixel definition layer 902. According to another embodiment, the first light emitting area 911 may mean an area, in which the first anode electrode 914 and the first organic light emitting layer 915 contact each other while another layer (e.g., the pixel definition layer 902) not being interposed therebetween. According to yet another embodiment, the first light emitting area 911 may mean an area, in which the first anode electrode 914 is exposed through the opening of the pixel definition layer 902. According to yet another embodiment, the first light emitting area 911 may be an area, in which the first anode electrode 914 is exposed through the opening of the pixel definition layer 902 such that light is emitted from the first organic light emitting layer 915.

According to yet another embodiment, the first light shielding member 913 may be located to be spaced apart from a border between the pixel definition layer 902 and the first light emitting area 911 by the same thickness ($\frac{1}{2}\Delta W$) as that of the first light shielding member 913 so as to have a thickness of $\frac{1}{2}\Delta W$, and to wrap a periphery of the first light emitting area 911 once. For example, the thickness of the first light shielding member 913 may be the same as the thickness ($\frac{1}{2}\Delta W$), by which it is spaced apart from the border of the first light emitting area 911. For example, W1 may be $W3=\frac{1}{2}\Delta W$.

According to yet another embodiment, an area of the first anode electrode 914 may be larger than that of the anode electrode (e.g., the anode electrode 521 of FIGS. 5 and 6) of the second embodiment (case "B"), in which there is no light shielding member that overlaps the light emitting area, by an area of the first light shielding member 913 that overlaps the first light emitting area 911.

According to yet another embodiment, an area of a first exposed area 912 when the first wide pixel 910 is viewed down vertically from a top may be $W1+W2+W3=W$ that is obtained by subtracting ΔW that is a sum of both the areas of the first light shielding member 913 from the area (W+ΔW) of the first light emitting area 911.

Meanwhile, a second light shielding member 923 of the second wide pixel 920 according to the first embodiment (case "A") may overlap a second light emitting area 921 to have a specific thickness (½ΔW) from borders of the second light emitting area 921 and the pixel definition layer 906 toward an inside of the second light emitting area 921 and to wrap a periphery of the second light emitting area 921 around once. For example, the second light shielding member 923 may not be spaced apart from a border of the second light emitting area 921, and one end of the second light emitting area 921 may coincide with the border of the second light emitting area 921.

According to yet another embodiment, an area of the second anode electrode 924 also may be larger than that of the anode electrode (e.g., the anode electrode 521 of FIGS. 5B and 6B) of the second embodiment (case "B"), in which there is no light shielding member that overlaps the light emitting area, by an area of the second light shielding member 923 that overlaps the second light emitting area 921.

According to yet another embodiment, an area of a second exposed area 922 when the second wide pixel 920 is viewed down vertically from a top may be the same as that of the first wide pixel 910, which is a value that is obtained by subtracting ΔW that is a sum of both the areas of the second light shielding member 923 from the area (W+ΔW) of the second light emitting area 921.

Because the area of the anode electrode is larger in the wide pixels of the third embodiment (case "C") and the first embodiment (case "A") than in the wide pixel (e.g., the wide pixels 520 of FIGS. 5B and 6B) of the second embodiment (case "B"), in which there is not light shielding member that overlaps the light emitting area, a larger amount of currents have to be supplied to the driving transistors for the wide pixels of the third embodiment (case "C") and the first embodiment (case "A") to maintain the same current density and brightness as those of the wide pixel of the second embodiment (case "B"). Accordingly, the driving transistor of the third embodiment (case "C") may be redesigned such that all of the brightness of the narrow pixels and the wide pixels of the third embodiment (case "C") are the same when the organic light emitting device is viewed down from a top vertically. Furthermore, the driving transistor of the first embodiment (case "A") may be redesigned such that all of the brightness of the narrow pixels and the wide pixels of the third embodiment (case "A") are the same when the organic light emitting device is viewed down from a top vertically.

The organic light emitting device may need to maintain the uniformity of the brightness in a normal watching condition, in which the organic light emitting device is viewed from the front side in a range of the first viewing angle (e.g., 0 to 5 degrees (°)). A general organic light emitting device may maintain 90% or more of the normal brightness at the first viewing angle. Accordingly, the organic light emitting device may require the uniformity of a high brightness at the first viewing angle.

Figure 10A:
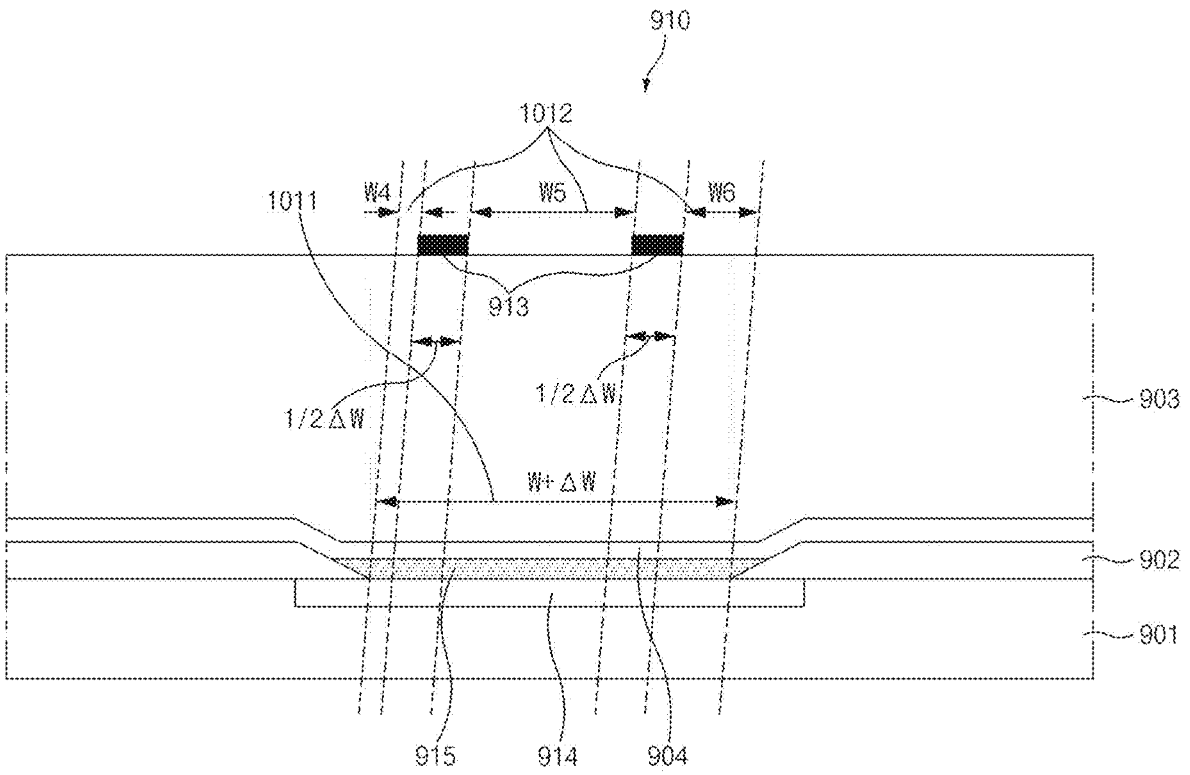
Figure 10B:
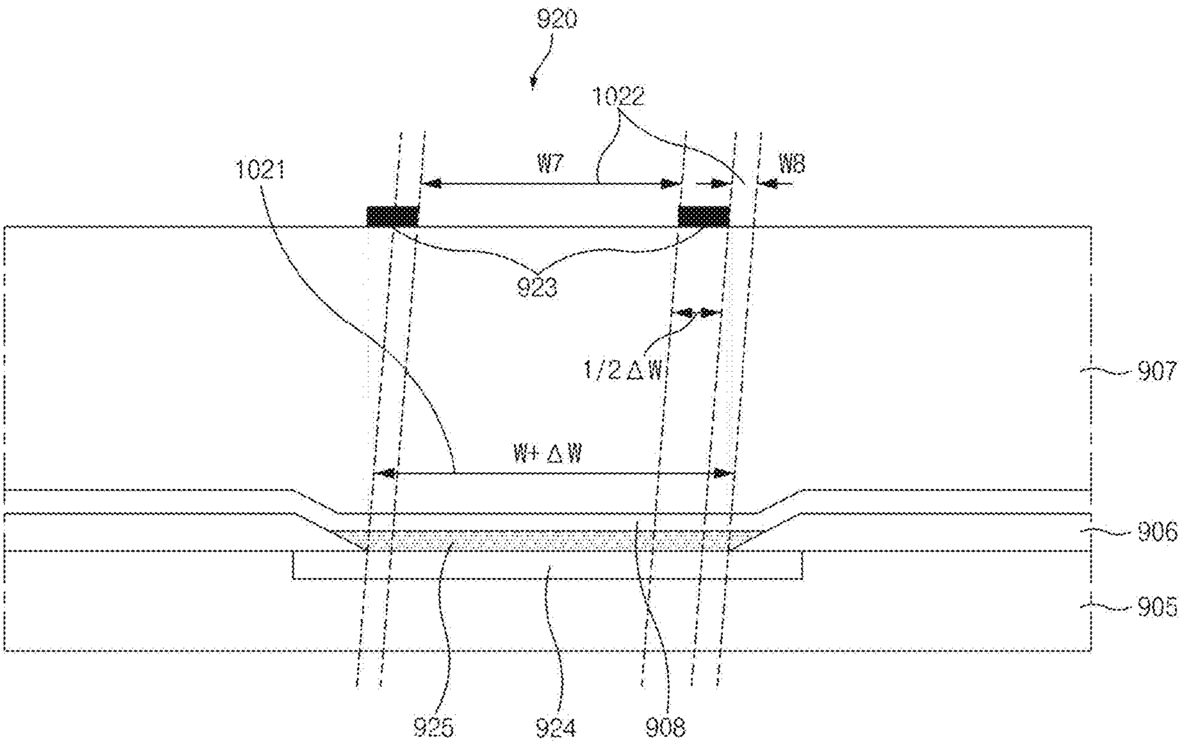

Referring to FIGS. 10A and 10B, the uniformity of the brightness of the organic light emitting device at the first viewing angle in the third embodiment (case "C") and the first embodiment (case "A") will be described in comparison.

Referring to FIGS. 10A and 10B, FIGS. 10A and 10B are views illustrating that the first wide pixel 910 and the second wide pixel 920, which is the same as those of FIGS. 9A and 9B, are viewed down from a top in a range of the first viewing angle (e.g., 0 to 5 degrees (°)).

When the second wide pixel 920 according to the first embodiment (case "A") is viewed down in the range of the first viewing angle, the area of a second exposed area 1022 may be W7+W8 that is larger than "W". Further, because the area of a second exposed area 1011 is obtained by covering the area (W+ΔW) of a second light emitting area 1021 by the area ½ΔW of one side of the second light shielding member 923 and at least partial area of the opposite side, it may be smaller than W+½ΔW that is an area that is obtained by subtracting the ½ΔW covered by the area ½ΔW of the one side of the second light shielding member 923 from the area (W+ΔW) of the second light emitting area 1021. That is, the area (W7+W8) of the second exposed area 1022 may be $W<W7+W8<W+\frac{1}{2}\Delta W$.

Meanwhile, in the first wide pixel 910 according to the third embodiment (case "C"), the area of a first exposed area 1012 is W4+W5+W6 when the first exposed area 1012 is viewed down in the range of the first viewing angle, and may be an area that is obtained by subtracting W+ΔW that is the area of a first light emitting area 1011 by ΔW as the opposite sides thereof is covered by the first light shielding member 913 by ½ΔW. For example, the area of the first exposed area 1012 may be W4+W5+W6=W.

Accordingly, it may be identified that, in the first embodiment (case "A"), the second exposed area 1022 is $W<W7+W8<W+\frac{1}{2}\Delta W$ in the range of the first viewing angle (e.g., 0 degrees (°) to 5 degrees (°)) and is larger than the second exposed area 922 ("W") on the front side (0 degrees (°)) and, in the third embodiment, the first exposed area 1012 is W4+W5+W6 in the range of the first viewing angle (e.g., 0 degrees (°) to 5 degrees (°)) and is the same as the first exposed area 912 (W1+W2+W3=W) on the front side (0 degrees (°)). For example, in the third embodiment (case "C"), the uniformity of the brightness of the pixels may be maintained in the range of the first viewing angle.

Referring to FIGS. 11A and 11B, a first graph 1110 and a second graph 1120 may be graphs obtained by measuring normalized brightness of pixels according to viewing angles. In the first graph 1110 and the second graph 1120, case "A" may represent the first embodiment (case "A") including the above-described light shielding member, one end of which coincides with the border of the light emitting area, case "B" may represent the second embodiment (case "B") that does not include the above-described light shielding member that overlaps the light emitting area, and case "C" may represent the third embodiment (case "C") including the above-described light shielding member that is spaced apart from the border of the light emitting area by the thickness of the light shielding member. In the first graph 1110, the narrow pixel may represent a brightness value of only the narrow pixel, and the wide pixel may represent a brightness value of only the wide pixel. In the second graph 1120, the wide pixel may represent a brightness value of only the wide pixel, and the normal mode may represent an average value of the brightness of the wide pixels and the narrow pixels in the normal mode.

Referring to the first graph 1110, the brightness of the wide pixel of the first embodiment (case "A") including the light shielding member, one end of which coincides with the border of the light emitting area may be higher than the brightness of the wide pixel of the second embodiment (case "B") that does not include the light shielding member that overlaps the light emitting area.

Furthermore, referring to the first graph 1110, it may be identified that the brightness of the wide pixel in the third embodiment (case "C") including the light shielding member that is spaced apart from the border of the light emitting area by the thickness of the light shielding member is higher than the brightness of the wide pixel of the second embodiment (case "B") that does not include the light shielding member that overlaps the light emitting area, but unlike in the first embodiment (case "A"), the uniformity of brightness is substantially maintained in the range of the first viewing angle (e.g., 0 degrees (°) to 5 degrees (°)) and the brightness increases after the first viewing angle. For example, it may be identified that, in the third embodiment (case "C"), the uniformity of the brightness of the pixels may be enhanced in the range of the first viewing angle.

Furthermore, although the configuration of the light shielding member that overlaps the light emitting area in the wide pixel has been described in the embodiments described above with reference to FIGS. 3, 4, 5A, 5B, 6A, 6B, 7A, 7B, 8A, 8B, 9A, 9B, 10A, and 10B, the configuration of the light shielding member that at least partially overlaps the light emitting area may be also applied to the narrow pixel according to the embodiment. For example, the light shielding member that has a specific thickness at the border of the light emitting area of the narrow pixel toward the inside of the light emitting area and wraps the periphery of the light emitting area around once may be located to overlap the light emitting area of the narrow pixel (case "A"). For example, the light shielding member that is spaced apart from the border of the light emitting area of the narrow pixel toward the inside of the light emitting area by a specific thickness and wraps the periphery of the light emitting area around once may be located to overlap the light emitting area of the narrow pixel (case "C").

Referring to the first graph 1110, it may be identified that the uniformity of the brightness is substantially maintained in the range of the first viewing angle (e.g., 0 degrees (°) to 5 degrees (°)) in the third embodiment (case "C") including the light shielding member that overlaps the narrow pixel and is spaced apart from the border of the light emitting area of the narrow pixel by the thickness of the light shielding member unlike the brightness of the narrow pixel of the first embodiment (case "A") including the light shielding member that has a specific thickness toward the inside of the light emitting area and overlaps the narrow pixel. For example, it may be identified that, in the third embodiment (case "C"), the uniformity of the brightness of the pixels may be enhanced in the range of the first viewing angle.

Referring to the second graph 1120, it may be identified that the average of the brightness of the wide pixels and the narrow pixels in the normal mode of the first embodiment (case "A") and the third embodiment (case "C") is lower than the brightness of only the wide pixels in the second embodiment (case "B"), but the uniformity of the brightness is maintained in the range of the first viewing angle in the normal mode of the third embodiment (case "C") than in the first embodiment (case "A").

Although it has been exemplified in the embodiments described with reference to FIGS. 9A, 9B, 10A, 10B, 11A, and 11B that the first viewing angle is 0 degrees (°) to 5 degrees (°), but the disclosure is not limited thereto.

A black matrix may be used as the light shielding member in the various embodiments of the disclosure, but the disclosure is not limited thereto, and any material having a transmission rate of a specific value or less may be used as the light shielding member. For example, when the organic light emitting electronic device is a touchscreen display including a touch panel, a metal wiring line layer used in a touch sensor may be used as the light shielding member. According to an embodiment, the metal wiring line layer used in the touch sensor may be located on the sealing part (a thin film encapsulation (TFE)), may overlap the pixel definition layer, and may not overlap the anode electrode and the light emitting area. When the metal wiring line of the touch sensor is used as the light shielding member, it may be formed of the same material as that of the metal wiring line of the touch sensor and may be formed at the same time in the same process as that of the wiring layer of the touch sensor. In an embodiment, the metal wiring line of the touch sensor may include an opaque conductive material. For example, the metal wiring line of the touch sensor may include a structure, in which a titanium (Ti) layer, an aluminum (Al) layer, and a titanium (Ti) layer are laminated. According to an embodiment, the metal wiring line used as the light shielding member may be located independently while not being connected to the metal wiring line of the touch sensor.

According to various embodiments of the disclosure, the pixel may include a plurality of sub-pixels (a red pixel, a green pixel, and a blue pixel). Then, the red pixel, the green pixel, and the blue pixel may have different sizes of the light emitting areas. To achieve the same viewing angle performance in the sub-pixels having different sizes of the light emitting areas, the areas of the light shielding members of the sub-pixels, which overlap the light emitting areas, may be different. According to an embodiment, when the light emitting area of the blue pixel is larger than that of the green pixel, the thickness of the light shielding member of the blue pixel, which overlaps the light emitting area, may be larger than the thickness of the light shielding member of the green pixel, which overlaps the light emitting area.

According to various embodiments of the disclosure, when the wide pixel includes the light shielding member that overlaps the light emitting area of the wide pixel, the area of the anode electrode may be increased by the area of the light shielding member. Accordingly, the area of the anode electrode of the wide pixel may be larger than the area of the anode electrode of the wide pixel that does not include the light shielding member that overlaps the light emitting area, but the narrow pixel requires the wide anode electrode as one sub-pixel is divided into the plurality of light emitting areas, and thus the area of the anode electrode of the wide pixel and the area of the anode electrode of the narrow pixel may be substantially the same.

A display device 160 according to an embodiment of the disclosure may include a substrate 401, a plurality of pixels disposed on the substrate and including a first pixel 310 and a second pixel 320, a first opaque member 315 located not to overlap a first light emitting area 451 of a first sub-pixel 311, 312, and 313 that displays a first color included in the first pixel and to surround a circumference of the first light emitting area, and a second opaque member 325 disposed to overlap at least a portion of a second light emitting area 452 of a plurality of second sub-pixels 321, 322, and 323 that displays a second color included in the second pixel and to wrap a periphery of the second light emitting area around once by a specific first thickness, the first light emitting area may be an area, in which a first anode electrode 411 of the first sub-pixel and a first organic light emitting layer 412 of the first sub-pixel contact each other, and the first light emitting area may include at least two divided areas, and the second light emitting area may be an area, in which a second anode electrode 421 of the second sub-pixel and a second organic light emitting layer 422 of the second sub-pixel contact each other, and the second pixel does not include an opaque member at a portion, at which the second pixel does not overlap the second light emitting area.

According to various embodiments of the disclosure, the second opaque member may be located to be adjacent to a border of the second light emitting area.

According to various embodiments of the disclosure, the second opaque member may be located to be spaced apart from a border of the second light emitting area by the first thickness.

According to various embodiments of the disclosure, the display panel may be a private mode panel that implements a private mode.

According to various embodiments of the disclosure, the first pixel may be a pixel, of which a viewing angle is smaller than that of the second pixel.

According to various embodiments of the disclosure, the second pixel may further include a third sub-pixel that displays a third color, the third sub-pixel may further include a third opaque member disposed to overlap at least a portion of a third light emitting area of the third sub-pixel and to wrap a periphery of the third light emitting area around once by a specific second thickness, the second color and the third color may be different from each other, and areas of the second electrode and a third electrode of the third sub-pixel may be different from each other.

According to various embodiments of the disclosure, the first thickness and the second thickness may be different from each other.

According to various embodiments of the disclosure, the first thickness may be larger than the second thickness when an area of the second electrode is larger than an area of the third electrode.

According to various embodiments of the disclosure, the display device may further include a touch panel, and a first light shielding member and a second light shielding member may be formed of the same material as that of a metal wiring line.

According to various embodiments of the disclosure, the first sub-pixel may include a third opaque member disposed to overlap at least a portion of the first light emitting area and to wrap a periphery of the first light emitting area around once by a specific second thickness.

According to various embodiments of the disclosure, the third opaque member may be located to be spaced apart from a border of the first light emitting area by a second thickness.

According to various embodiments of the disclosure, a display driving circuit of the display device may supply electric power to the first pixel and the second pixel such that a difference of a brightness of the first pixel and a brightness of the second pixel is a threshold value or more in a normal mode when the display device is viewed from a front side.

An electronic device 101 according to an embodiment of the disclosure may include a display panel 160, a communication module 190 (e.g., a communication circuitry), memory 130, and a processor 120 connected to the display panel, the communication module, and the memory, the display panel may include a first opaque member 351 located not to overlap a first light emitting area 451 of a first sub-pixel 311, 312, and 313 that displays a first color included in the first pixel 310 and to surround a circumference of the first light emitting area, and a second opaque member 325 disposed to overlap at least a portion of a second light emitting area 452 of a second sub-pixel 321, 322, and 323 that displays a second color included in the second pixel 320 and to wrap a periphery of the second light emitting area 452 around once by a specific first thickness, the first light emitting area may be an area, in which a first anode electrode 411 of the first sub-pixel and a first organic light emitting layer 412 of the first sub-pixel contact each other, and the first light emitting area includes at least two divided areas, and the second light emitting area may be an area, in which a second anode electrode 421 of the second sub-pixel and a second organic light emitting layer 422 of the second sub-pixel contact each other, and the second pixel does not include an opaque member at a portion, at which the second pixel does not overlap the second light emitting area.

According to various embodiments of the disclosure, the second opaque member may be located to be adjacent to a border of the second light emitting area.

According to various embodiments of the disclosure, the second opaque member may be located to be spaced apart from a border of the second light emitting area by a first thickness.

According to various embodiments of the disclosure, the display panel may be a private mode panel that implements a private mode.

According to various embodiments of the disclosure, the first pixel may be a pixel, of which a viewing angle is smaller than that of the second pixel.

According to an embodiment of the disclosure, the second pixel may further include a third sub-pixel that displays a third color, the third sub-pixel may further include a third opaque member disposed to overlap at least a portion of a third light emitting area of the third sub-pixel and to wrap a periphery of the third light emitting area around once by a specific second thickness, the second color and the third color may be different, and areas of the second electrode and a third electrode of the third sub-pixel may be different from each other.

According to various embodiments of the disclosure, the first thickness and the second thickness may be different from each other.

According to various embodiments of the disclosure, the first thickness may be larger than the second thickness when an area of the second electrode is larger than an area of the third electrode.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A display device comprising:

a substrate;

a plurality of pixels disposed on the substrate and including a first pixel and a second pixel;

a first opaque member located not to overlap a first light emitting area of a first sub-pixel that displays a first color included in the first pixel and to surround a circumference of the first light emitting area; and a second opaque member disposed to overlap at least a portion of a second light emitting area of a second sub-pixel that displays a second color included in the second pixel and to wrap a periphery of the second light emitting area around once by a specific first thickness, wherein the first light emitting area is an area, in which a first electrode of the first sub-pixel and a first organic light emitting layer of the first sub-pixel contact each other, and the first light emitting area comprises at least two divided areas, and wherein the second light emitting area is an area, in which a second electrode of the second sub-pixel and a second organic light emitting layer of the second sub-pixel contact each other, and the second pixel does not include an opaque member at a portion, at which the second pixel does not overlap the second light emitting area.

2. The display device of claim 1, wherein the second opaque member is located to be adjacent to a border of the second light emitting area.

3. The display device of claim 1, wherein the second opaque member is located to be spaced apart from a border of the second light emitting area by the specific first thickness.

4. The display device of claim 1, wherein the display device is a private mode panel that implements a private mode.

5. The display device of claim 1, wherein the first pixel is a pixel having a viewing angle smaller than that of the second pixel.

6. The display device of claim 1, wherein the second pixel further comprises a third sub-pixel that displays a third color, wherein the third sub-pixel comprises a third opaque member disposed to overlap at least a portion of a third light emitting area of the third sub-pixel and to wrap a periphery of the third light emitting area around once by a specific second thickness, wherein the second color and the third color are different from each other, and wherein areas of the second electrode and a third electrode of the third sub-pixel are different from each other.

7. The display device of claim 6, wherein the specific first thickness and the specific second thickness are different from each other.

8. The display device of claim 6, wherein the specific first thickness is larger than the specific second thickness when an area of the second electrode is larger than an area of the third electrode.

9. The display device of claim 1, further comprising:

a touch panel, wherein a first light shielding member and a second light shielding member are formed of the same material as that of a metal wiring line.

10. The display device of claim 1, wherein the first sub-pixel includes a third opaque member disposed to overlap at least a portion of the first light emitting area and to wrap a periphery of the first light emitting area around once by a specific second thickness.

11. The display device of claim 10, wherein the third opaque member is located to be spaced apart from a border of the first light emitting area by a specific second thickness.

12. The display device of claim 1, further comprising:

a display driving circuit of the display device, wherein the display driving circuit is configured to supply electric power to the first pixel and the second pixel such that a difference of brightness of the first pixel and the second pixel is a threshold value or less in a normal mode when the display device is viewed from a front side.

13. An electronic device comprising:

a display panel;

a communication circuitry;

memory; and a processor connected to the display panel, the communication circuitry, and the memory, wherein the display panel comprises:

a plurality of pixels including a first pixel and a second pixel, a first opaque member located not to overlap a first light emitting area of a first sub-pixel that displays a first color included in the first pixel and to surround a circumference of the first light emitting area, and a second opaque member disposed to overlap at least a portion of a second light emitting area of a second sub-pixel that displays a second color included in the second pixel and to wrap a periphery of the second light emitting area around once by a specific first thickness, wherein the first light emitting area is an area, in which a first electrode of the first sub-pixel and a first organic light emitting layer of the first sub-pixel contact each other, and the first light emitting area includes at least two divided areas, and wherein the second light emitting area is an area, in which a second electrode of the second sub-pixel and a second organic light emitting layer of the second sub-pixel contact each other, and the second pixel does not include an opaque member at a portion, at which the second pixel does not overlap the second light emitting area.

14. The electronic device of claim 13, wherein the second opaque member is located to be adjacent to a border of the second light emitting area.

15. The electronic device of claim 13, wherein the second opaque member is located to be spaced apart from a border of the second light emitting area by the specific first thickness.

16. The electronic device of claim 13, wherein the display panel is a private mode panel that implements a private mode.

17. The electronic device of claim 13, wherein the first pixel is a pixel having a viewing angle smaller than that of the second pixel.

18. The electronic device of claim 15, wherein the second pixel further includes a third sub-pixel that displays a third color, wherein the third sub-pixel includes a third opaque member disposed to overlap at least a portion of a third light emitting area of the third sub-pixel and wrap a periphery of the third light emitting area around once by a specific second thickness, wherein the second color and the third color are different from each other, and wherein areas of the second electrode and a third electrode of the third sub-pixel are different from each other.

19. The electronic device of claim 18, wherein the specific first thickness and the specific second thickness are different.

20. The electronic device of claim 18, wherein the specific first thickness is larger than the specific second thickness when an area of the second electrode is larger than an area of the third electrode.

* * * * *